(12) United States Patent
Wang et al.

(10) Patent No.: US 10,679,947 B2
(45) Date of Patent: Jun. 9, 2020

(54) CHIP PACKAGE AND MANUFACTURING METHOD THEREOF

(71) Applicant: Taiwan Semiconductor Manufacturing Co., Ltd., Hsinchu (TW)

(72) Inventors: Chuei-Tang Wang, Taichung (TW); Chen-Hua Yu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/905,722

(22) Filed: Feb. 26, 2018

(65) Prior Publication Data
US 2019/0157209 A1    May 23, 2019

Related U.S. Application Data

(60) Provisional application No. 62/589,533, filed on Nov. 21, 2017.

(51) Int. Cl.
*H01L 23/538* (2006.01)
*H01L 23/31* (2006.01)
(Continued)

(52) U.S. Cl.
CPC ...... *H01L 23/5389* (2013.01); *H01L 21/4853* (2013.01); *H01L 21/4857* (2013.01); *H01L 21/565* (2013.01); *H01L 21/568* (2013.01); *H01L 21/6835* (2013.01); *H01L 23/3114* (2013.01); *H01L 23/3121* (2013.01); *H01L 23/5383* (2013.01); *H01L 23/5386* (2013.01); *H01L 24/19* (2013.01); *H01L 24/20* (2013.01); *H01L 25/0652* (2013.01); *H01L 25/0657* (2013.01); *H01L 25/50* (2013.01); *H01L 24/29* (2013.01); *H01L 24/32* (2013.01); *H01L 24/48* (2013.01); *H01L 24/73* (2013.01); *H01L 24/83* (2013.01); *H01L 2221/68372* (2013.01); *H01L 2224/18* (2013.01); *H01L 2224/214* (2013.01); *H01L 2224/2919* (2013.01); *H01L 2224/32145* (2013.01); *H01L 2224/32225* (2013.01); *H01L 2224/48091* (2013.01);
(Continued)

(58) Field of Classification Search
None
See application file for complete search history.

(56) References Cited

U.S. PATENT DOCUMENTS 8,993,380 B2    3/2015  Hou et al.
9,000,584 B2    4/2015  Lin et al.
(Continued)

*Primary Examiner* — Long Pham
(74) *Attorney, Agent, or Firm* — JCIPRNET

(57) ABSTRACT

A chip package includes a redistribution layer, at least one first semiconductor chip, an integrated fan-out package, and an insulating encapsulation. The at least one first semiconductor chip and the integrated fan-out package are electrically connected to the redistribution layer, wherein the at least one first semiconductor chip and the integrated fan-out package are located on a surface of the redistribution layer and electrically communicated to each other through the redistribution layer, and wherein the integrated fan-out package includes at least one second semiconductor chip. The insulating encapsulation encapsulates the at least one first semiconductor chip and the integrated fan-out package.

20 Claims, 22 Drawing Sheets

(51) Int. Cl.
*H01L 23/00* (2006.01)
*H01L 25/065* (2006.01)
*H01L 21/48* (2006.01)
*H01L 21/56* (2006.01)
*H01L 21/683* (2006.01)
*H01L 25/00* (2006.01)

(52) U.S. Cl.
CPC ............ *H01L 2224/48227* (2013.01); *H01L 2224/73265* (2013.01); *H01L 2224/73267* (2013.01); *H01L 2224/83191* (2013.01); *H01L 2225/0651* (2013.01); *H01L 2225/06524* (2013.01); *H01L 2225/06527* (2013.01); *H01L 2225/06548* (2013.01); *H01L 2225/06562* (2013.01); *H01L 2225/06582* (2013.01); *H01L 2924/00014* (2013.01); *H01L 2924/15311* (2013.01); *H01L 2924/181* (2013.01)

(56) References Cited

U.S. PATENT DOCUMENTS

| | | |
|---|---|---|
| 9,048,222 B2 | 6/2015 | Wu et al. |
| 9,048,233 B2 | 6/2015 | Hou et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,299,649 B2 | 3/2016 | Chiu et al. |
| 9,368,460 B2 | 6/2016 | Yu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,666,502 B2 | 5/2017 | Chen et al. |
| 9,735,131 B2 | 8/2017 | Su et al. |
| 2018/0158798 A1* | 6/2018 | Lin .................. H01L 24/97 |

* cited by examiner

CHIP PACKAGE AND MANUFACTURING METHOD THEREOF

CROSS-REFERENCE TO RELATED APPLICATION

This application claims the priority benefit of U.S. provisional application Ser. No. 62/589,533, filed on Nov. 21, 2017. The entirety of the above-mentioned patent application is hereby incorporated by reference herein and made a part of this specification.

BACKGROUND

Semiconductor devices and integrated circuits used in a variety of electronic applications, such as cell phones and other mobile electronic equipment, are typically manufactured on a single semiconductor wafer. The semiconductor chips of the wafer may be processed and packaged with other semiconductor devices, semiconductor chips, semiconductor package.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
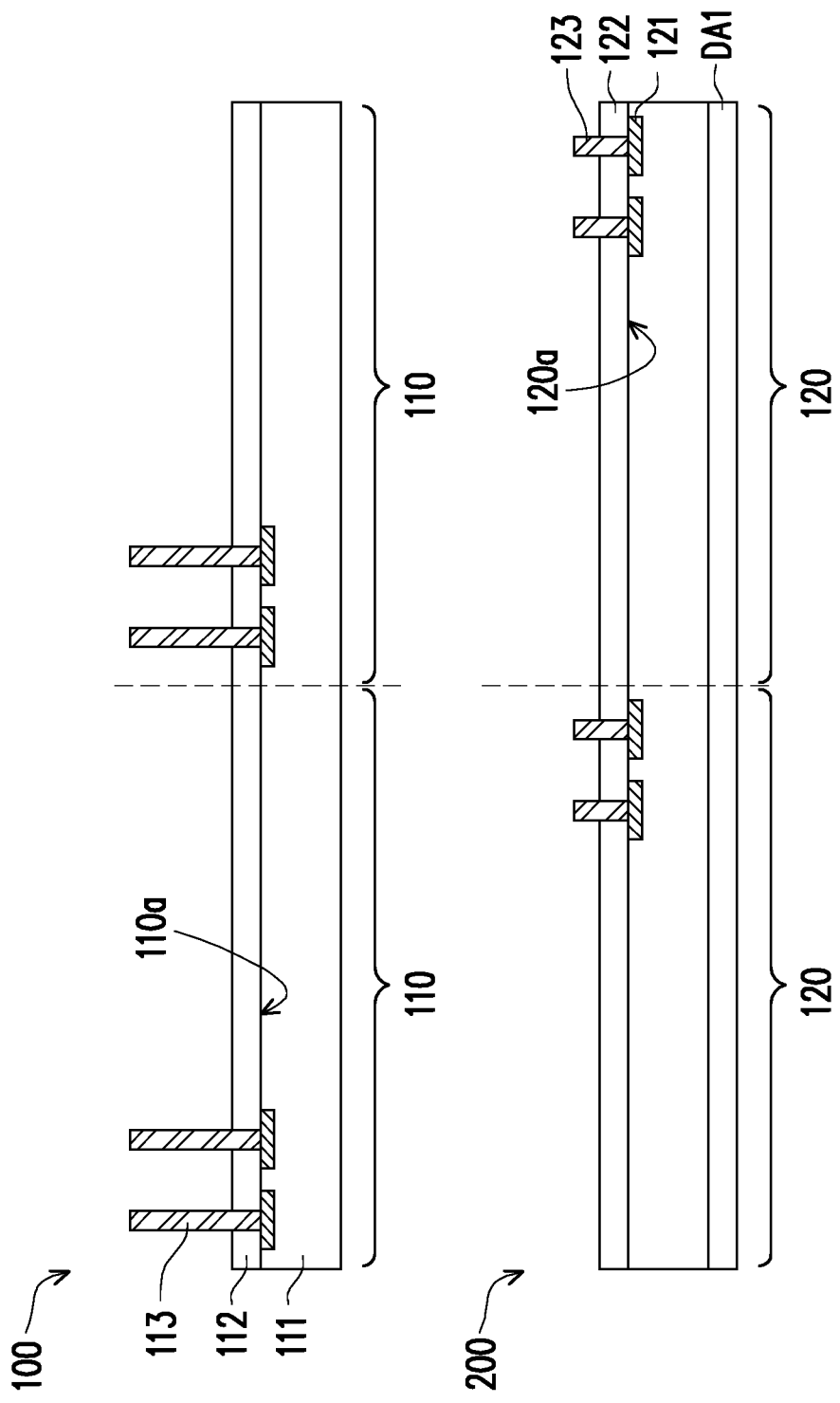
FIG. 1 to FIG. 11 are schematic cross sectional views of various stages in a manufacturing method of a chip package in accordance with some exemplary embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," and the like, may be used herein for ease of description to describe similar or different element(s) or feature(s) as illustrated in the figures, and may be used interchangeably depending on the order of the presence or the contexts of the description.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1 to FIG. 11 are schematic cross sectional views of various stages in a manufacturing method of a chip package in accordance with some exemplary embodiments of the present disclosure. In FIG. 1 to FIG. 11, a chip package 10 is shown to represent a chip package obtained following the manufacturing method, for example. In exemplary embodiments, the manufacturing method is part of a wafer level packaging process. It is to be noted that the processing steps described herein cover a portion of the manufacturing processes used to fabricate a chip package. The embodiments are intended to provide further explanations but are not used to limit the scope of the present disclosure. In FIG. 1, for example, two semiconductor chips (e.g. two semiconductor chips 110 or two semiconductor chips 120) are shown to represent plural semiconductor chips of the wafer; in addition, in FIG. 2 to FIG. 11, one semiconductor chip 160 is shown to represent single or plural semiconductor chips, and one integrated fan-out package 50a is shown to represent single or plural integrated fan-out packages, the disclosure is not limited thereto. In other embodiments, two or more semiconductor chips are shown to represent plural semiconductor chips and two or more integrated fan-out packages are shown to represent plural integrated fan-out packages, and two or more chip packages are shown to represent plural chip packages obtained following the (semiconductor) manufacturing method, the disclosure is not limited thereto.

Referring to FIG. 1, in some embodiments, a wafer 100 including semiconductor chips 110 and a wafer 200 including semiconductor chips 120 are provided, and a dicing process is performed to cut the wafer 100 and the wafer 200 along a cutting line (shown as the dotted line in FIG. 1) into individual and separated semiconductor chips 110 and individual and separated semiconductor chips 120. In one embodiment, the dicing process is a wafer dicing process. In some embodiments, the semiconductor chips 110 and the semiconductor chips 120 include low-power (LP) double data rate (DDR) memory modules, such as LPDDR1, LPDDR2, LPDDR3, LPDDR4, or the like memory modules. In one embodiment, the semiconductor chips 110 and the semiconductor chips 120 may be the same type. In an alternative embodiment, the semiconductor chips 110 and the semiconductor chips 120 may be different types. However, the disclosure is not limited thereto; in an alternative embodiment, the semiconductor chips 110 and the semiconductor chips 120 may include wireless and radio frequency (RF) chips, digital chips, analog chips or mixed signal chips, application-specific integrated circuit ("ASIC") chips, sensor chips, other memory chips, logic chips or voltage regulator chips.

In certain embodiments, each semiconductor chip 110 has an active surface 110a, contact pads 111 distributed on the active surface 110a, a protection layer 112 covering the active surface 110a and a portion of the contact pads 111, and connecting pillars 113 connected to the portion of the contact pads 111 and penetrating and protruding out of the protection layer 112. The contact pads 111 are partially exposed by the protection layer 112, and the connecting pillars 113 are disposed on and electrically connected to the contact pads 111, respectively. As shown in FIG. 1, the connecting pillars 113 protrude out of a top surface of the protection layer 112, in some embodiments. That is, a portion of each of the connecting pillars 113 is not covered or wrapped by the protection layer 112.

In certain embodiments, each semiconductor chip 120 has an active surface 120a, contact pads 121 distributed on the active surface 120a, a protection layer 122 covering the active surface 120a and a portion of the contact pads 121, and connecting pillars 123 connected to the portion of the contact pads 121 and penetrating and protruding out of the protection layer 122. The contact pads 121 are partially exposed by the protection layer 122, and the connecting pillars 123 are disposed on and electrically connected to the contact pads 121, respectively. In some embodiments, before the dicing process, a connecting film DA1 is provided to a bottom surface of the second wafer 200. In some embodiments, the connecting film DA1 may be, for example, a semiconductor chip attach film, a layer made of adhesives or epoxy resin, or the like, the disclosure is not limited thereto. As shown in FIG. 1, the connecting pillars 123 protrude out of a top surface of the protection layer 122, for example. That is, a portion of each of the connecting pillars 123 is not covered or wrapped by the protection layer 122, in certain embodiments.

Figure 12:
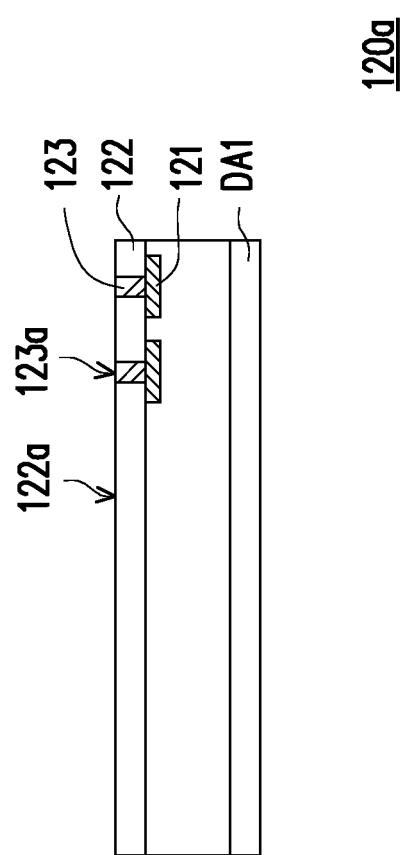
FIG. 12 is a schematic cross sectional view illustrating a semiconductor chip in accordance with some exemplary embodiments of the present disclosure.

However, the disclosure is not limited thereto; in an alternative embodiment, for a semiconductor chip 120a, top surfaces 123a of the connecting pillars 123 may be substantially coplanar with a top surface 122a of the protection layer 122, as shown in FIG. 12. The semiconductor chip 120a depicted in FIG. 12 is similar to the semiconductor chip 120 depicted in FIG. 1, such that the elements similar to or substantially the same as the elements described above will use the same reference numbers, and certain details or descriptions of the same elements and the relationship thereof (e.g. the relative positioning configuration and electrical connection) will not be repeated herein. Due to such configuration, the connecting pillars 123 are protected from being damaged during the transferring step of the semiconductor chip 120a, and thereby the reliability of electrical connections in the integrated fan-out package 50a' is further improved.

In some embodiments, the contact pads 111 and/or the contact pads 121 may be aluminum pads or other suitable metal pads. In one embodiment, the materials of the contact pads 111 and the contact pads 121 may be the same, the disclosure is not limited thereto. In an alternative embodiment, the material of the contact pads 111 is different from the material of the contact pads 121.

In some embodiments, the protection layer 112 and/or the protection layer 122 may be a polybenzoxazole (PBO) layer, a polyimide (PI) layer or other suitable polymers. In some alternative embodiments, the protection layer 112 and/or the protection layer 122 may be made of inorganic materials, such as silicon oxide, silicon nitride, silicon oxynitride, or any suitable dielectric material. In one embodiment, the materials of the protection layer 112 and the protection layer 122 may be the same, the disclosure is not limited thereto. In an alternative embodiment, the material of the protection layer 112 is different from the material of the protection layer 122.

In some embodiments, the connecting pillars 113 and/or the connecting pillars 123 are copper pillars, copper alloy pillar or other suitable metal pillars. In one embodiment, the materials of the connecting pillars 113 and the connecting pillars 123 may be the same, the disclosure is not limited thereto. In an alternative embodiment, the material of the connecting pillars 113 is different from the material of the connecting pillars 123.

Figure 2:
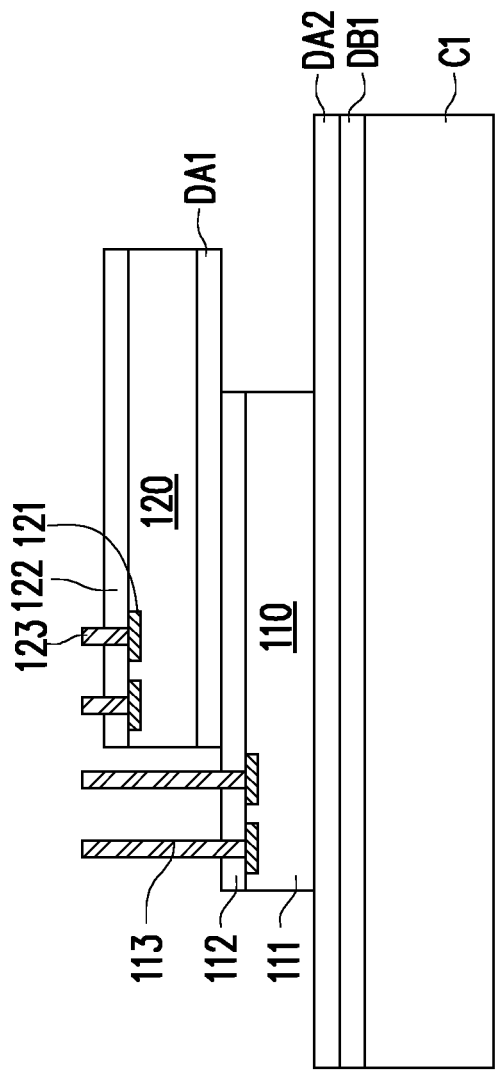

Referring to FIG. 2, in some embodiments, a carrier C1 is provided, the carrier C1 may be a glass carrier or any suitable carrier for the manufacturing method of the chip package. In some embodiments, the carrier C1 is provided with a debond layer DB1 and a connecting film DA2 formed thereon, where the debond layer DB1 is located between the carrier C1 and the connecting film DA2. In some embodiments, the material of the debond layer DB1 may be any material suitable for debonding the carrier C1 from the above layers (e.g. the connecting film DA2) disposed thereon. For example, the debond layer DB1 may include a release layer (such as a light-to-heat conversion ("LTHC") layer) or an adhesive layer (such as a ultra-violet curable adhesive or a heat curable adhesive layer). It may also be noted that materials for the carrier C1 and the debond layer DB1 are not limited to what are disclosed herein according to the disclosure. In certain embodiments, the materials of the connecting film DA2 and the connecting film DA1 may be the same, however the disclosure is not limited thereto. In one embodiment, the material of the connecting film DA2 may be different from the material of the connecting film DA1.

In an alternative embodiment, an insulating layer (not shown) may be formed between the debond layer DB1 and the connecting layer DA2. For example, the insulating layer may be a polybenzoxazole (PBO) layer formed on the debond layer DB1. However, the disclosure is not limited thereto.

Referring to FIG. 2, in some embodiments, after the carrier C1 having the debond layer DB1 and the connecting film DA2 is provided, one or more semiconductor chips 110 and one or more semiconductor chips 120 depicted in FIG. 1 are picked-up and placed on the connecting film DA2 carried by the carrier C1 through the debond layer DB1. As shown in FIG. 2, for example, the semiconductor chip 110 is mechanically connected and stably adhered to the connecting film DA2, while the semiconductor chip 120 is stacked on the semiconductor chip 110 through the connecting film DA1. Due to the connecting film DA1 provided between the semiconductor chip 110 and the semiconductor chip 120, the semiconductor chip 110 and the semiconductor chip 120 are stably adhered to one another. In certain embodiments, as shown in FIG. 2, the semiconductor chip 110 and the semiconductor chip 120 are front-to-back attached.

Figure 3:
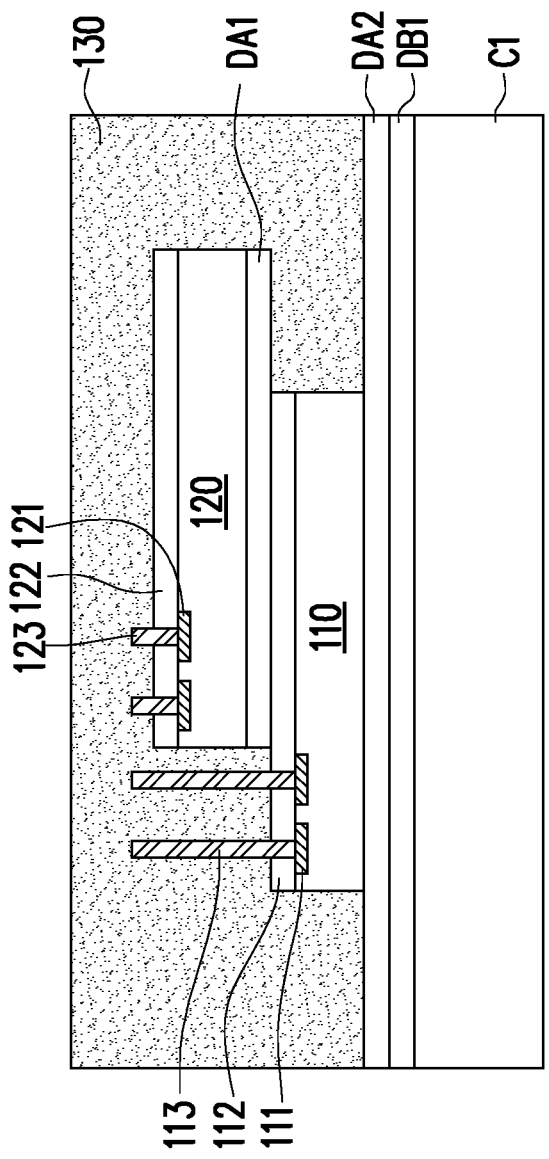

Referring to FIG. 3, an encapsulant 130 is formed over the carrier C1 (e.g., on the connecting film DA2) to encapsulate the semiconductor chip 110 and the semiconductor chip 120. In other words, the semiconductor chip 110 and the semiconductor chip 120 are covered by and embedded in the encapsulant 130. That is, for example, the semiconductor chip 110 and the semiconductor chip 120 are not accessibly exposed by the encapsulant 130, as shown in FIG. 3. In some embodiments, the encapsulant 130 is a molding compound formed by a molding process, and the material of the encapsulant 130 may include epoxy or other suitable resins. For example, the encapsulant 130 may be epoxy resin containing inorganic filler or inorganic compound (e.g. silica, clay, and so on) which can be added therein to optimize coefficient of thermal expansion (CTE) of the encapsulant 130. The disclosure is not limited thereto.

Figure 4:
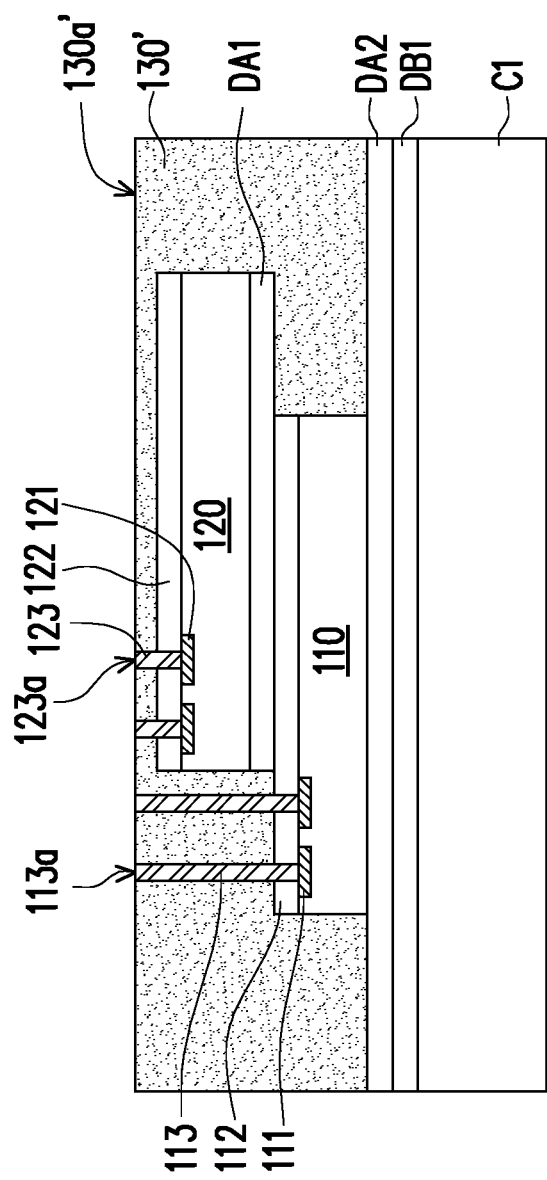

Referring to FIG. 3 and FIG. 4, in some embodiments, the encapsulant 130 is planarized to form an encapsulant 130' exposing the semiconductor chip 110 and the semiconductor chip 120. In certain embodiments, as shown in FIG. 4, after the planarization, top surfaces 113a of the connecting pillars 113 of the semiconductor chip 110 and top surfaces 123a of the connecting pillars 123 of the semiconductor chip 120 are accessibly exposed by a top surface 130a' of the encapsulant 130'. That is, for example, the top surfaces 113a of the connecting pillars 113 of the semiconductor chip 110 and the top surfaces 123a of the connecting pillars 123 of the semiconductor chip 120 become substantially leveled with the top surface 130a' of the encapsulant 130'. In other words, the top surfaces 113a of the connecting pillars 113 of the semiconductor chip 110, the top surfaces 123a of the connecting pillars 123 of the semiconductor chip 120, and the top surface 130a' of the encapsulant 130' are substantially coplanar to each other.

The encapsulant 130 may be planarized by mechanical grinding or chemical mechanical polishing (CMP), for example. After the planarizing step, a cleaning step may be optionally performed, for example to clean and remove the residue generated from the planarizing step. However, the disclosure is not limited thereto, and the planarizing step may be performed through any other suitable method.

In some embodiments, during planarizing the encapsulant 130, the connecting pillars 113 of the semiconductor chip 110 and the connecting pillars 123 of the semiconductor chip 120 may also be planarized. In certain embodiments, the planarizing step may, for example, performed on the overmolded encapsulant 130 to level the top surface 130a' of the encapsulant 130', the top surfaces 113a of the connecting pillars 113 of the semiconductor chip 110, and the top surfaces 123a of the connecting pillars 123 of the semiconductor chip 120.

Figure 5:
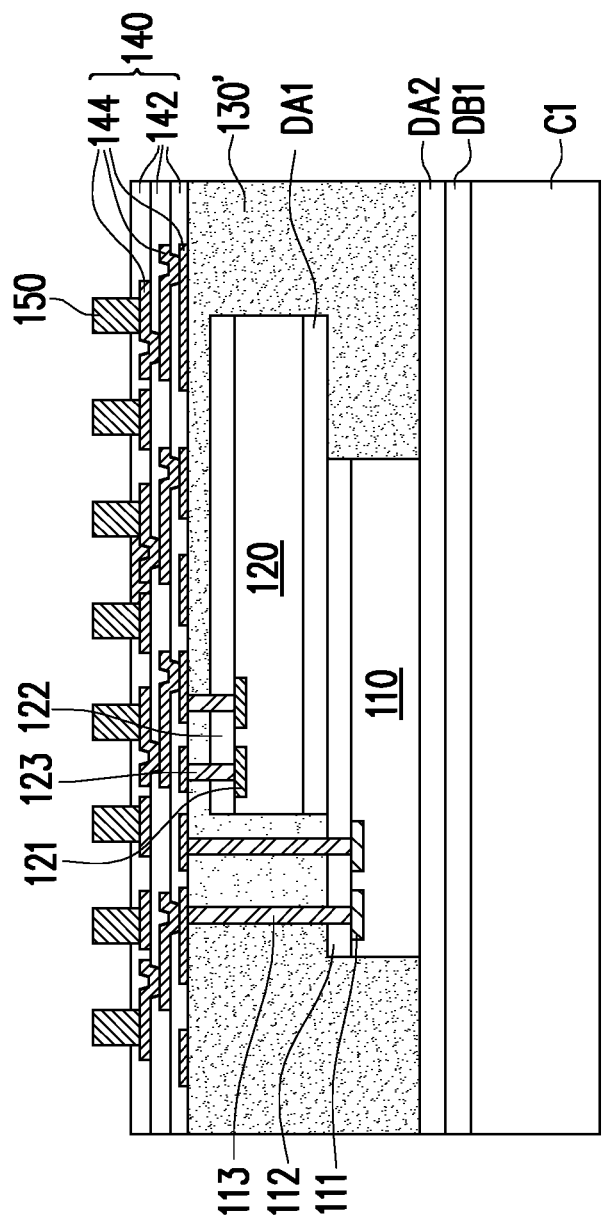

Referring to FIG. 5, in some embodiments, a redistribution layer 140 and conductive features 150 are sequentially formed on the encapsulant 130', the semiconductor chip 110, and the semiconductor chip 120. As shown in FIG. 5, the redistribution layer 140 is formed on the top surface 130a' of the encapsulant 130', the top surfaces 113a of the connecting pillars 113 of the semiconductor chip 110, and the top surfaces 123a of the connecting pillars 123 of the semiconductor chip 120. In some embodiments, the redistribution layer 140 is electrically connected to the semiconductor chip 110 through the connecting pillars 113 and is electrically connected to the semiconductor chip 120 through the connecting pillars 123. As shown in FIG. 5, for example, the redistribution layer 140 is referred as a front-side redistribution layer of the semiconductor chip 110 and the semiconductor chip 120, which provides a routing function for the semiconductor chip 110 and the semiconductor chip 120.

In some embodiments, the formation of the redistribution layer 140 includes sequentially forming one or more polymer dielectric layers 142 and one or more metallization layers 144 in alternation. In certain embodiments, as shown in FIG. 5, the metallization layers 144 are sandwiched between the polymer dielectric layers 142, but the top surface of the topmost layer of the metallization layers 144 is exposed by the topmost layer of the polymer dielectric layers 142 to connect the conductive features 150, and the lowest layer of the metallization layers 144 is exposed by the lowest layer of the polymer dielectric layers 142 to connect the connecting pillars 113 of the semiconductor chip 110 and the connecting pillars 123 of the semiconductor chip 120.

In some embodiments, the material of the polymer dielectric layers 142 includes polyimide, epoxy resin, acrylic resin, phenol resin, benzocyclobutene (BCB), polybenzooxazole (PBO), or any other suitable polymer-based semiconductor chiplectric material, and the polymer dielectric layers 142 may be formed by coating. In some embodiments, the material of the metallization layers 144 includes aluminum, titanium, copper, nickel, tungsten, and/or alloys thereof, and the metallization layers 144 may be formed by electroplating or deposition. However, it should be noted that the redistribution layer 140 is not limited to include three polymer dielectric layers and/or three metallization layers.

Continued on FIG. 5, in some embodiments, the conductive features 150 are formed on the redistribution structure 140. In certain embodiments, the conductive features 150 are formed on the exposed top surface of the topmost layer of the metallization layers 144 of the redistribution structure 140 for electrically connecting with conductive elements (e.g. a connecting module or the like) and/or semiconductor elements (e.g., passive components or active components). In one embodiment, the conductive features 150 may be formed by forming a mask pattern (not shown) covering the redistribution layer 140 with openings exposing the exposed lowest layer of the metallization layers 144 of the redistribution layer 140, forming a metallic material filling the openings to form the conductive features 150 by electroplating or deposition, and then removing the mask pattern. In one embodiment, the material of the conductive features 150 may include a metal material such as copper or copper alloys, or the like. However, the disclosure is not limited thereto. As shown in FIG. 5, for example, the exposed lowest layer of the metallization layers 144 of the redistribution layer 140 is mechanically and electrically connected to the connecting pillars 113 of the semiconductor chip 110 and the connecting pillars 123 of the semiconductor chip 120, and the exposed top surface of the topmost layer of the metallization layers 160b is mechanically and electrically connected to the conductive features 150. In some embodiments, through the redistribution layer 140, some of the conductive features 150 are electrically connected to the semiconductor chip 110, and some of the conductive features 150 are electrically connected to the semiconductor chip 120.

Figure 6:
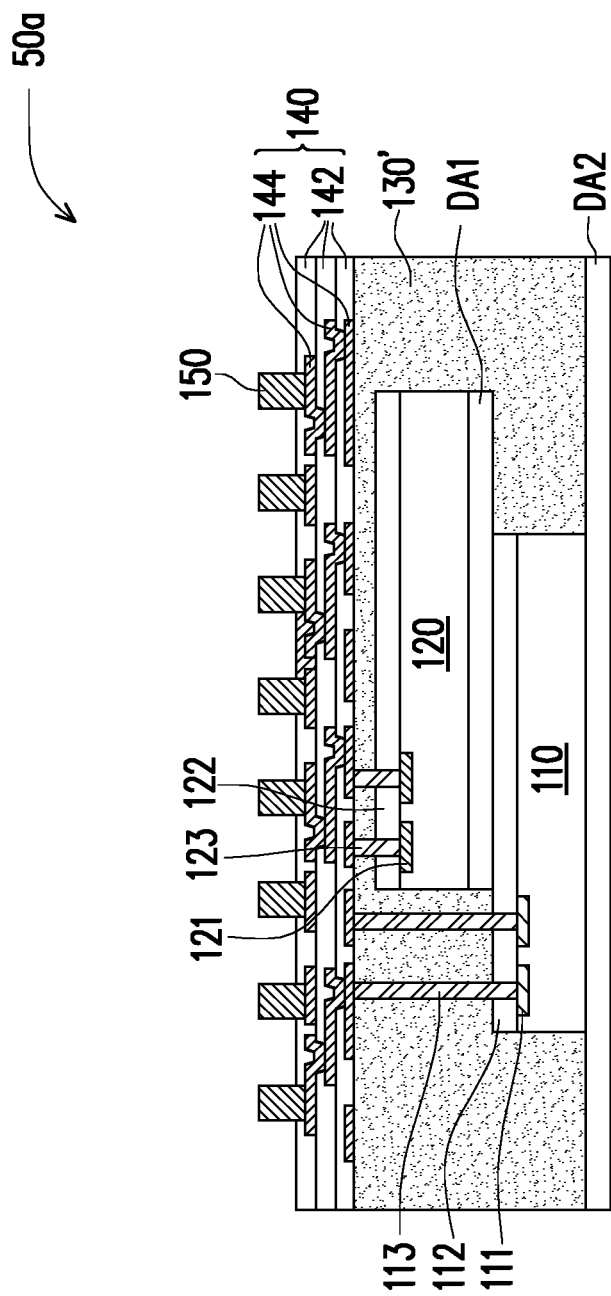

Referring to FIG. 6, in some embodiments, the carrier C1 is debonded from the connecting film DA2 to form the integrated fan-out package 50a. In one embodiment, the debonding process is a laser debonding process. The connecting film DA2 is easily separated from the carrier C1 due to the debond layer DB1. In some embodiments, the connecting film DA2 is debonded from the carrier C1, the carrier C1 and the debond layer DB1 are removed, and the connecting film DA2 are exposed. Up to here, the manufacture of the integrated fan-out package 50a is completed.

In some embodiments, prior to debonding the carrier C1, a dicing process is performed to cut a plurality of the integrated fan-out packages 50a connected to one another into individual and separated integrated fan-out packages 50a. For example, during the debonding step, a holding device (not shown) is adopted to secure a position of the plurality of the integrated fan-out packages 50a connected to one another before debonding the carrier C1 and the debond layer DB1, where the conductive features 150 are held by the holding device. For example, the holding device may be an adhesive tape, a carrier film or a suction pad.

In some embodiments, prior to releasing the conductive features 150 from the holding device, the dicing process is performed to cut the plurality of the integrated fan-out packages 50a connected to one another into individual and separated integrated fan-out packages 50a. In one embodiment, the dicing process is a wafer dicing process including mechanical blade sawing or laser cutting. The disclosure is not limited thereto.

Figure 13:
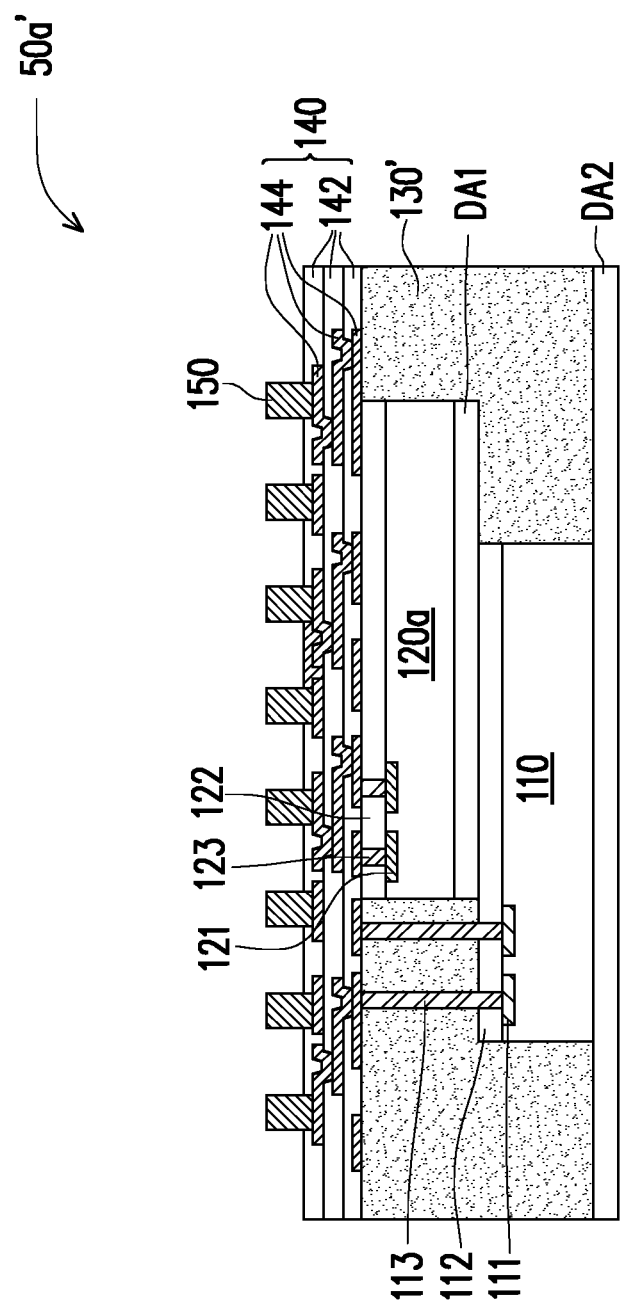
FIG. 13 is a schematic cross sectional view illustrating an integrated fan-out package in accordance with some exemplary embodiments of the present disclosure.

However, the disclosure is not limited thereto; in some alternative embodiments, as shown in FIG. 13, an integrated fan-out package 50a' similar to the integrated fan-out package 50a depicted in FIG. 6 is demonstrated, where the integrated fan-out package 50a' includes the semiconductor chip 120a (of FIG. 13) instead of the semiconductor chip 120 included in the integrated fan-out package 50a. The elements similar to or substantially the same as the elements described above will use the same reference numbers, and certain details or descriptions of the same elements and the relationship thereof (e.g. the relative positioning configuration and electrical connection) are not repeated herein. As shown in FIG. 13, the connecting pillars 123 of the semiconductor chip 120a are not in physical contact with the encapsulant 130', for example. In some embodiments, the top surfaces of the connecting pillars 113 of the semiconductor chip 110, the top surfaces of the protection layer 122 and the connecting pillars 123 of the semiconductor chip 120a, the top surface of the encapsulant 130' are substantially levelled with and coplanar to each other.

Figure 7:
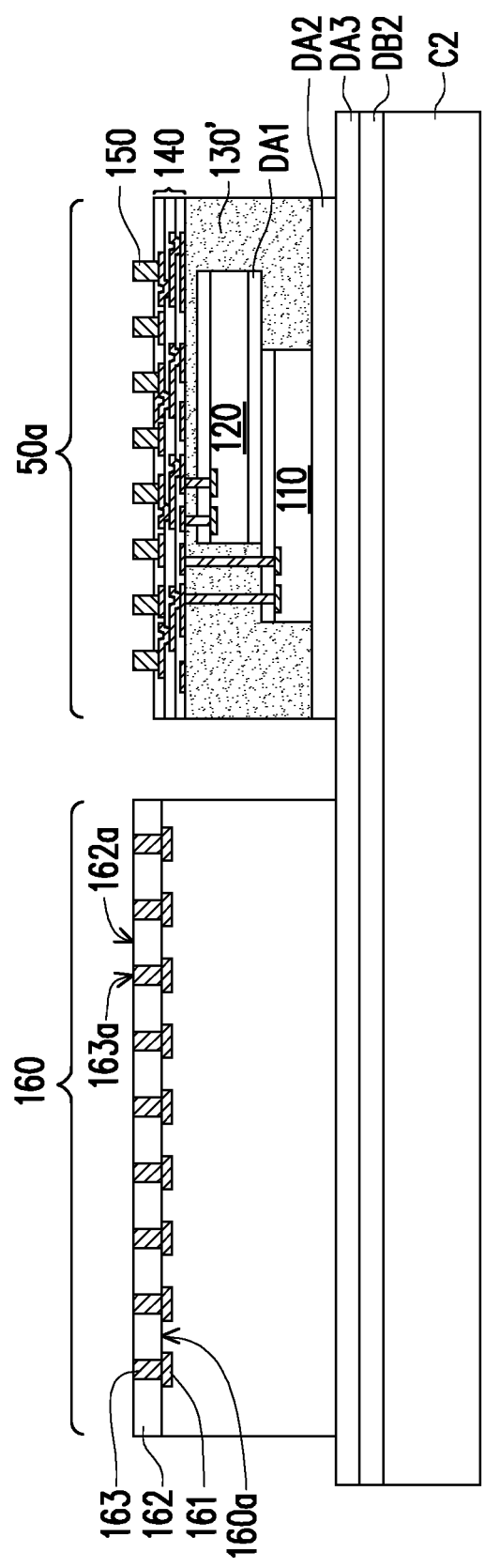

Referring to FIG. 7, in some embodiments, at least one semiconductor chip 160 is provided. As shown in FIG. 7, for example, the integrated fan-out package 50a depicted in FIG. 6 and the semiconductor chip 160 are picked up and placed on a carrier C2 with a debond layer DB2 and a connecting film DA3 formed thereon, where the debond layer DB2 is located between the carrier C2 and the connecting film DA3. In some embodiments, the carrier C2 may be a glass carrier or any suitable carrier for the manufacturing method of the chip package. In some embodiments, the material of the debond layer DB2 may be any material suitable for debonding the carrier C2 from the above layers (e.g. the connecting film DA3) disposed thereon. For example, the debond layer DB2 may include a release layer (such as a LTHC layer) or an adhesive layer (such as a ultra-violet curable adhesive or a heat curable adhesive layer). In some embodiments, the connecting film DA3 may be, for example, a semiconductor chip attach film, a layer made of adhesives or epoxy resin, or the like, the disclosure is not limited thereto. In one embodiment, the materials of the carrier C1 and the carrier C2 may be the same or different, and the materials of the debond layer DB1 and the debond layer DB2 may be the same or different, and/or the materials of the connecting film DA1, the connecting film DA2, and the connecting film DA3 may be the same or different; the disclosure is not limited thereto.

In an alternative embodiment, an insulating layer (not shown) may be formed between the debond layer DB2 and the connecting layer DA3. For example, the insulating layer may be a polybenzoxazole (PBO) layer formed on the debond layer DB2. However, the disclosure is not limited thereto. Due to the connecting layer DA3, the semiconductor chip 160 and the integrated fan-out package 50a are stably adhered to the debond layer DB2.

In certain embodiments, the semiconductor chip 160 has an active surface 160a, contact pads 161 distributed on the active surface 160a, a protection layer 162 covering the active surface 160a and a portion of the contact pads 161, and connecting pillars 163 connected to the portion of the contact pads 161 and penetrating through the protection layer 162. The portion of the contact pads 161 are partially exposed by the protection layer 162, and the connecting pillars 163 are disposed on and electrically connected to the contact pads 161, respectively. As shown in FIG. 7, for example, top surfaces 163a of the connecting pillars 163 is substantially coplanar with a top surface 162a of the protection layer 162. In some embodiments, the contact pads 161 may be aluminum pads or other suitable metal pads. In some embodiments, the protection layer 162 may be a polybenzoxazole (PBO) layer, a polyimide (PI) layer or other suitable polymers. In some alternative embodiments, the protection layer 162 may be made of inorganic materials, such as silicon oxide, silicon nitride, silicon oxynitride, or any suitable dielectric material. In some embodiments, the connecting pillars 163 are copper pillars, copper alloy pillar or other suitable metal pillars.

As shown in FIG. 7, only one semiconductor chip 160 is presented for illustrative purposes; however, it should be noted that one or more semiconductor chips may be provided. In some embodiments, the semiconductor chip 160 described herein is referred as a logic chip. In some embodiments, the semiconductor chip 160 may further include additional chip(s) of the same type or different types. For example, in an alternative embodiment, more than one semiconductor chip 160 are provided, and the semiconductor chips 160, except for including at least one logic chip, may include the same or different types of chips selected from digital chips, analog chips or mixed signal chips, application-specific integrated circuit ("ASIC") chips, wireless and radio frequency (RF) chips, sensor chips, memory chips, or voltage regulator chips. The disclosure is not limited thereto.

Figure 8:
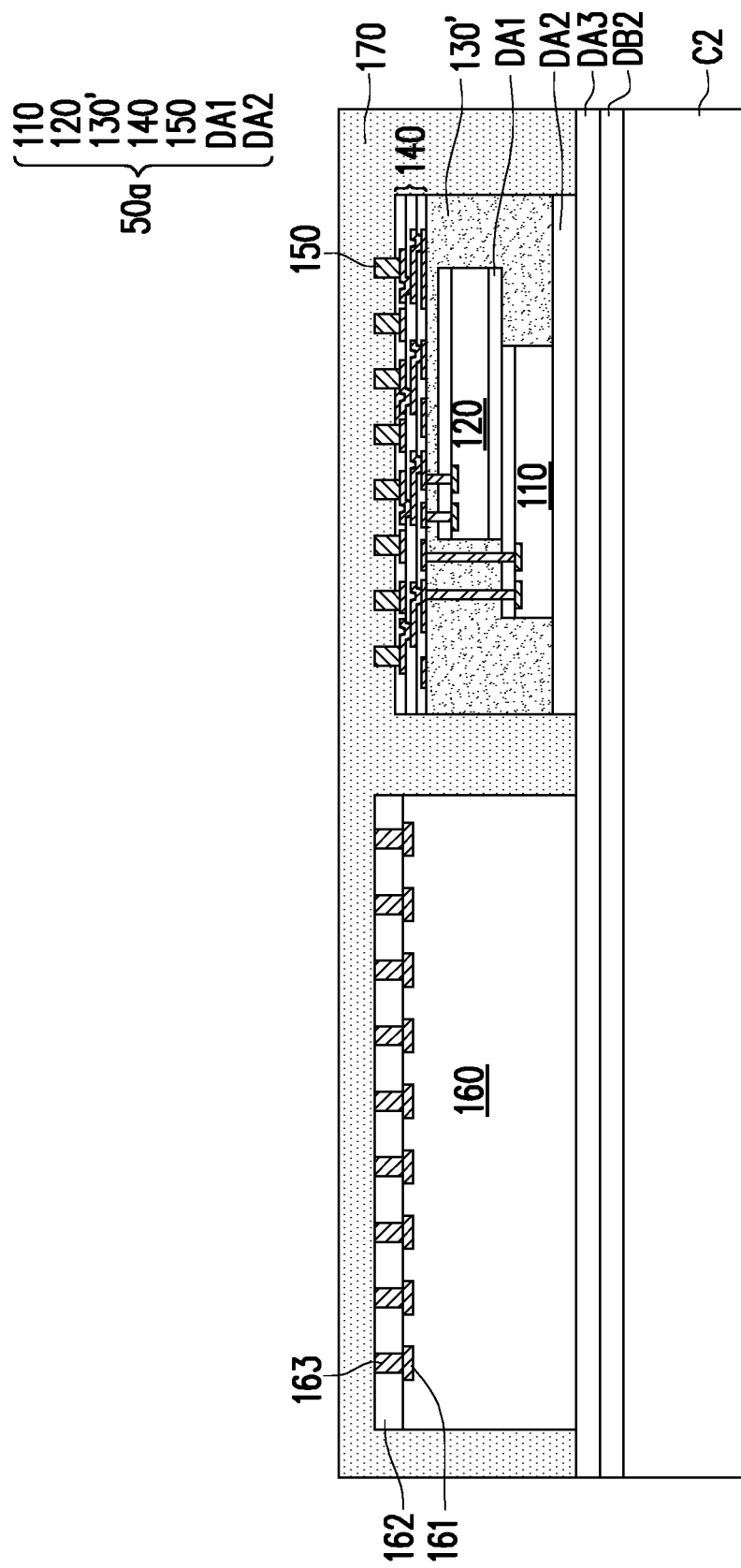

Referring to FIG. 8, in some embodiments, an insulating encapsulation 170 is formed over the carrier C2 (e.g., on the connecting film DA3) to encapsulate the semiconductor chip 160 and the integrated fan-out package 50*a*. In other words, the insulating encapsulation 170 at least fills the gaps between the conductive features 150 of the integrated fan-out package 50*a* and between the semiconductor chip 160 and the integrated fan-out package 50*a*, where the semiconductor chip 160 and the integrated fan-out package 50*a* are covered by and embedded in the insulating encapsulation 170. That is, for example, the semiconductor chip 160 and the integrated fan-out package 50*a* are not accessibly exposed by the insulating encapsulation 170, as shown in FIG. 8. In some embodiments, the insulating encapsulation 170 is a molding compound formed by a molding process, and the material of the insulating encapsulation 170 may include epoxy or other suitable resins. For example, the insulating encapsulation 170 may be epoxy resin containing inorganic filler or inorganic compound (e.g. silica, clay, and so on) which can be added therein to optimize coefficient of thermal expansion (CTE) of the insulating encapsulation 170. The disclosure is not limited thereto. In one embodiment, the materials of the encapsulants 130/130' and the insulating encapsulation 170 are the same. In an alternative embodiment, the material of the insulating encapsulation 170 is different from the encapsulants 130/130'.

Figure 9:
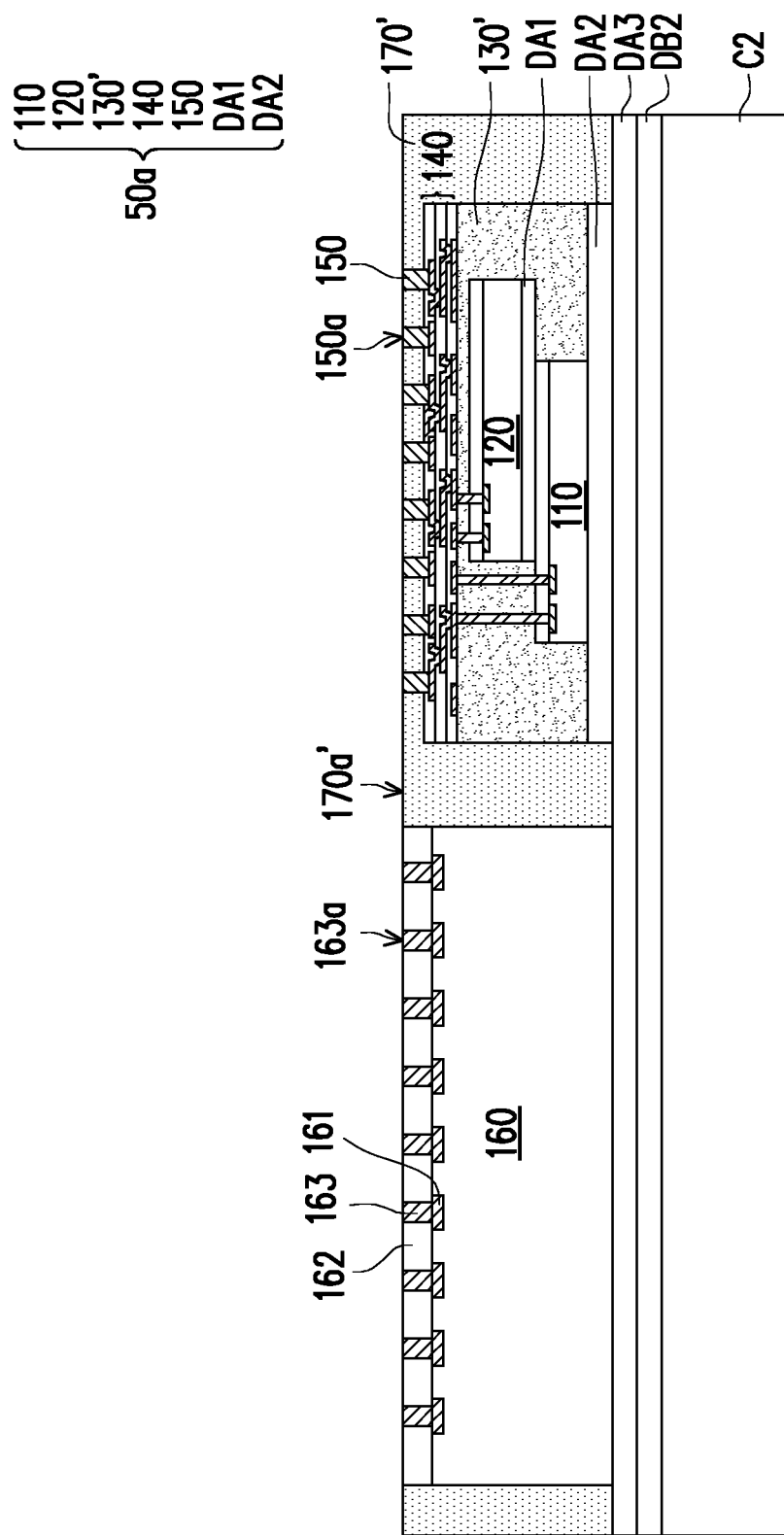

Referring to FIG. 9, in some embodiments, the insulating encapsulation 170 is planarized to form an insulating encapsulation 170' exposing the semiconductor chip 160 and the integrated fan-out package 50*a*. In certain embodiments, as shown in FIG. 9, after the planarization, top surfaces 163*a* of the connecting pillars 163 of the semiconductor chip 160 and top surfaces 150*a* of the conductive features 150 of the integrated fan-out package 50*a* are accessibly exposed by a top surface 170*a*' of the insulating encapsulation 170'. That is, for example, the top surfaces 163*a* of the connecting pillars 163 of the semiconductor chip 160 and the top surfaces 150*a* of the conductive features 150 of the integrated fan-out package 50*a* become substantially leveled with the top surface 170*a*' of the insulating encapsulation 170'. In other words, the top surfaces 163*a* of the connecting pillars 163 of the semiconductor chip 160, the top surfaces 150*a* of the conductive features 150 of the integrated fan-out package 50*a*, and the top surface 170*a*' of the insulating encapsulation 170' are substantially coplanar to each other. Due to the integrated fan-out package 50*b* and the semiconductor chip 160 are both encapsulated in the insulating encapsulation 170', a thickness of the chip package 10 is significantly reduced.

For example, the insulating encapsulation 170 may be planarized by mechanical grinding or CMP. After the planarizing step, a cleaning step may be optionally performed, for example to clean and remove the residue generated from the planarizing step. However, the disclosure is not limited thereto, and the planarizing step may be performed through any other suitable method. In some embodiments, during planarizing the insulating encapsulation 170, the connecting pillars 163 of the semiconductor chip 160 and the conductive features 150 of the integrated fan-out package 50*a* may also be planarized. In certain embodiments, the planarizing step may, for example, performed on the over-molded insulating encapsulation 170 to level the top surface 170*a*' of the insulating encapsulation 170', the top surfaces 163*a* of the connecting pillars 163 of the semiconductor chip 160, and the top surfaces 150*a* of the conductive features 150 of the integrated fan-out package 50*a*. As shown in FIG. 9, in some embodiments, the connecting pillars 163 of the semiconductor chip 160 is separated from the insulating encapsulation 170' by the protection layer 162, and the conductive features 150 of the integrated fan-out package 50*a* are partially wrapped by the insulating encapsulation 170'. That is, the sidewalls of the conductive features 150 are in physical contact with the insulating encapsulation 170'.

Figure 10:
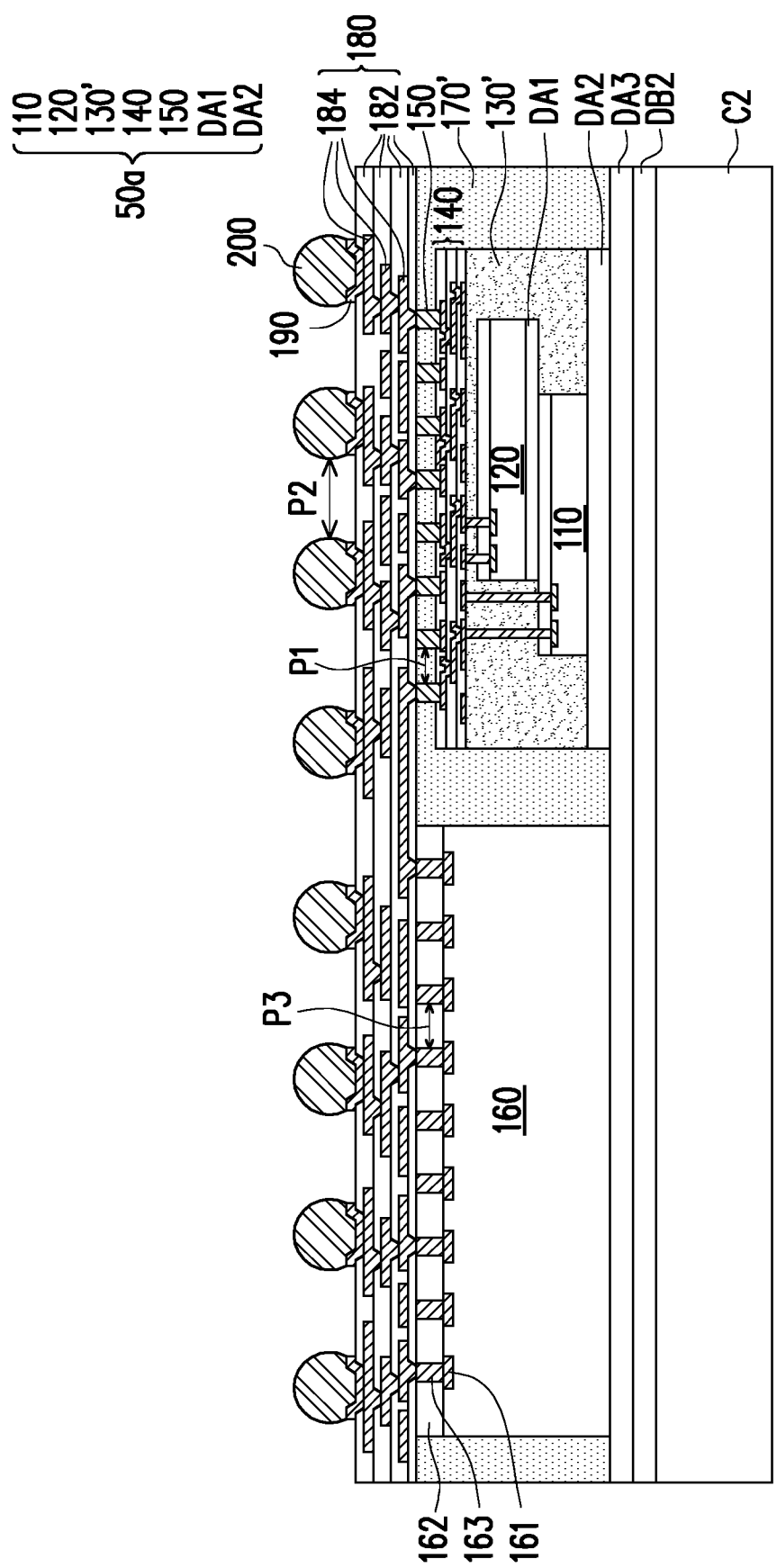

Referring to FIG. 10, in some embodiments, a redistribution layer 180 is formed on the insulating encapsulation 170', the semiconductor chip 160, and the integrated fan-out package 50*a*. As shown in FIG. 10, the redistribution layer 180 is formed on the top surface 170*a*' of the insulating encapsulation 170', the top surfaces 163*a* of the connecting pillars 163 of the semiconductor chip 160, the top surfaces 150*a* of the conductive features 150 of the integrated fan-out package 50*a*. In some embodiments, the redistribution layer 180 is electrically connected to the semiconductor chip 160 through the connecting pillars 163 and is electrically connected to the integrated fan-out package 50*a* through the conductive features 150. As shown in FIG. 10, for example, the redistribution layer 180 is referred as a front-side redistribution layer of the semiconductor chip, which provides a routing function for the semiconductor chip 160 and the integrated fan-out package 50*a*.

In some embodiments, the formation of the redistribution layer 180 includes sequentially forming one or more polymer dielectric layers 182 and one or more metallization layers 184 in alternation. In certain embodiments, as shown in FIG. 10, the metallization layers 184 are sandwiched between the polymer dielectric layers 182, but the top surface of the topmost layer of the metallization layers 184 is exposed by the topmost layer of the polymer dielectric layers 182, and the lowest layer of the metallization layers 184 is exposed by the lowest layer of the polymer dielectric layers 182 to connect the connecting pillars 163 of the semiconductor chip 160 and the conductive features 150 of the integrated fan-out package 50*a*. The materials and formations of the polymer dielectric layers 182 and the polymer dielectric layers 142 may be the same or different, for example. The materials and formations of the metallization layers 184 and the metallization layers 144 may be the same or different, for example. Additionally, it should be noted that the redistribution layer 180 is not limited to include four polymer dielectric layers and/or three metallization layers.

In some embodiments, the semiconductor chip 160 is electrically connected to the semiconductor chip 110 through the redistribution layer 180, some of the conductive features 150, the redistribution layer 140, the connecting pillars 113, and the connecting pads 111, and is electrically connected to the semiconductor chip 120 through the redistribution layer 180, some of the conductive features 150, the redistribution layer 140, the connecting pillars 123, and the connecting pads 121. Through the redistribution layer 180, the integrated fan-out package 50*a* and the semiconductor chip 160 are electrically communicated to each other. With such configuration, a shorter electrical connection path from the semiconductor chip 160 to the integrated fan-out package 50*a* is achieved; the chip package 10 has better electrical performance.

Continued on FIG. 10, in some embodiments, a plurality of under-ball metallurgy (UBM) patterns 190 is formed on the exposed top surface of the topmost layer of the metallization layers 184 of the redistribution structure 180 for electrically connecting with conductive elements (e.g. conductive balls) and/or semiconductor elements (e.g., passive components or active components). As shown in FIG. 10, for example, the redistribution layer 180 includes a front-side redistribution layer structure having the lowest layer of the metallization layers 184 physically and electrically connected to the semiconductor chip 160 and the integrated fan-out package 50a, and the exposed top surface of the topmost layer of the metallization layers 184 physically and electrically connected to the UBM patterns 190 for assisting ball mounting. In some embodiments, the material of the UBM patterns 1960, for example, may include copper, nickel, titanium, tungsten, or alloys thereof or the like, and may be formed by an electroplating process, for example. As shown in FIG. 10, only eight UBM patterns 190 are presented in FIG. 10 for illustrative purposes, however, it should be noted that less than or more than eight UBM patterns 190 may be formed based on the demand; the disclosure is not limited thereto.

As shown in FIG. 10, in some embodiments, conductive elements 200 are formed on and electrically connected to the redistribution layer 180. In one embodiment, the conductive elements 200 are formed on the redistribution layer 180 through the UBM patterns 190. That is, the UBM patterns 190 are located between the redistribution layer 180 and the conductive elements 200, respectively. In some embodiments, some of the conductive elements 200 are electrically connected to the semiconductor chip 160 through some of the UBM patterns 190 and the redistribution layer 180, and some of the conductive elements 200 are electrically connected to the integrated fan-out package 50a through some of the UBM patterns 190 and the redistribution layer 180. In certain embodiments, some of the conductive elements 200 are electrically connected to the semiconductor chip 110 or the semiconductor chip 120 through some of the UBM patterns 190, the redistribution layer 180, the respective conductive features 150, and the redistribution layer 140. In some embodiments, the conductive elements 200 are attached to the UBM patterns 190 through a solder flux. In some embodiments, the conductive elements 200 are, for example, solder balls or ball grid array (BGA) balls. In some embodiments, the conductive elements 200 may be disposed on the UBM patterns 190 by ball placement process or reflow process. In some embodiments, the redistribution layer 180 is located between the conductive elements 200 and the integrated fan-out package 50a, between the conductive elements 200 and the semiconductor chip 160, and between the conductive elements 200 and the insulating encapsulation 170'.

As shown in FIG. 10, in some embodiments, a pitch P1 between two adjacent conductive features 150 of the conductive features 150 is less than a pitch P2 between two adjacent conductive elements 200 of the conductive elements 200. In some embodiments, a pitch P2 between two adjacent connecting pillars 163 of the connecting pillars 163 is less than the pitch P2 between two adjacent conductive elements 200 of the conductive elements 200. In some embodiments, the pitch P1 between two adjacent conductive features 150 of the conductive features 150 may be substantially equal to the pitch P2 between two adjacent connecting pillars 163 of the connecting pillars 163. In one embodiment, the pitch P1 between two adjacent conductive features 150 of the conductive features 150 may be greater than or less than the pitch P2 between two adjacent connecting pillars 163 of the connecting pillars 163, the disclosure is not limited thereto.

In an alternative embodiment, the UBM patterns 190 may be omitted, the disclosure is not limited thereto. In such embodiment, the conductive elements 200 are mechanically and electrically connected to the exposed top surface of the topmost layer of the metallization layers 184, and parts of the topmost layer of the metallization layers 184 underlying the conductive elements 200 function as UBM layers. Additionally, solder paste (not shown) or flux may optionally applied onto to the exposed top surface of the topmost layer of the metallization layers 184, so that the conductive elements 200 are better fixed to the exposed top surface of the topmost layer of the metallization layers 184, however the disclosure is not limited thereto.

Figure 11:
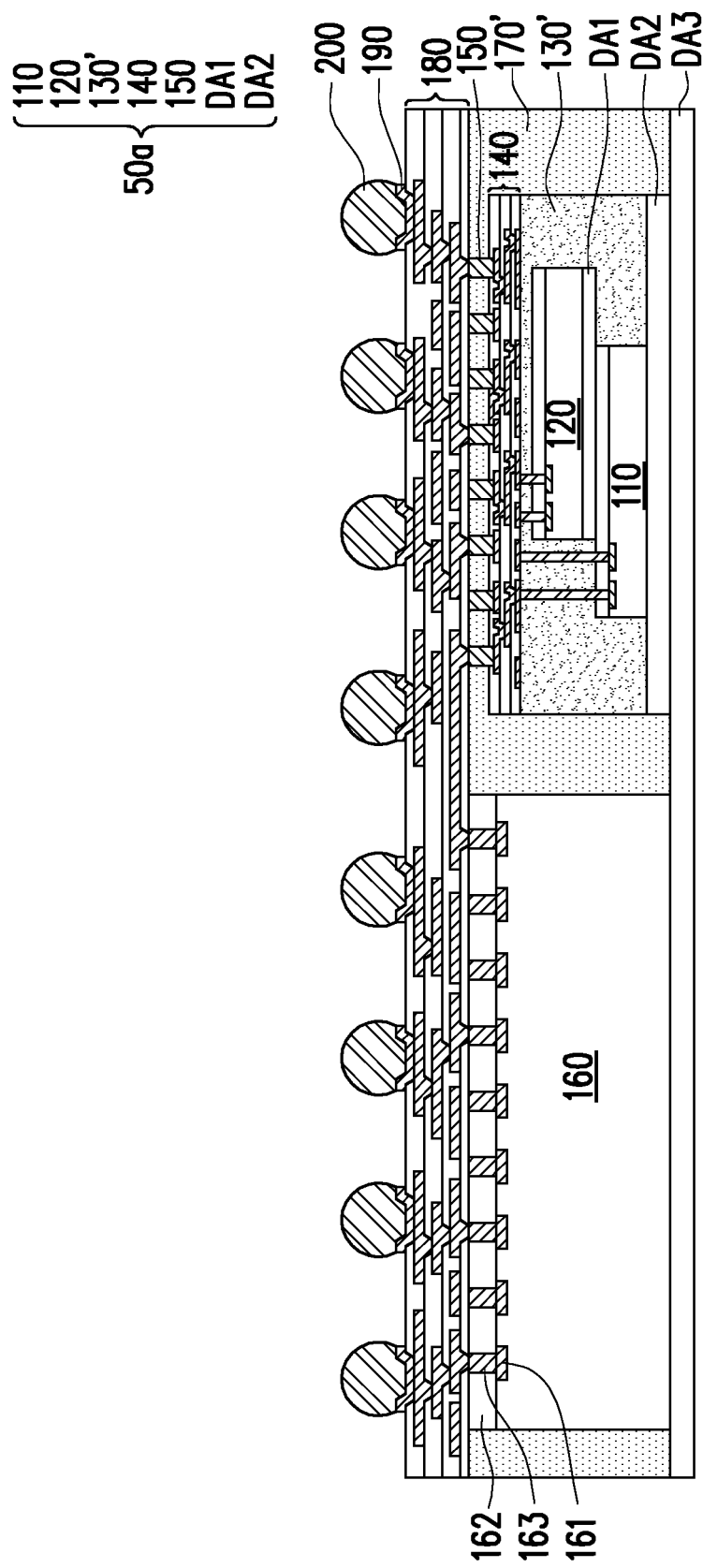

Referring to FIG. 11, in some embodiments, the carrier C2 is debonded from the connecting film DA3 to form the chip package 10. In one embodiment, the debonding process is a laser debonding process. The connecting film DA3 is easily separated from the carrier C3 due to the debond layer DB2. In some embodiments, the connecting film DA3 is debonded from the carrier C2, the carrier C2 and the debond layer DB2 are removed, and the connecting film DA3 are exposed. Up to here, the manufacture of the chip package 10 is completed. In an alternative embodiment, the connecting film DA3 may be further removed to expose the insulating encapsulation 170', the semiconductor chip 160, and the integrated fan-out package 50a; however, the disclosure is not limited thereto.

In some embodiments, prior to debonding the carrier C2, a dicing process is performed to cut a plurality of the chip packages 10 connected to one another into individual and separated chip packages 10. For example, during the debonding step, a holding device (not shown) is adopted to secure a position of the plurality of the chip packages 10 connected to one another before debonding the carrier C2 and the debond layer DB2, where the conductive elements 200 are held by the holding device. For example, the holding device may be an adhesive tape, a carrier film or a suction pad.

In some embodiments, prior to releasing the conductive elements 200 from the holding device, the dicing process is performed to cut the plurality of the chip packages 10 connected to one another into individual and separated chip packages 10. In one embodiment, the dicing process is a wafer dicing process including mechanical blade sawing or laser cutting.

Figure 14:
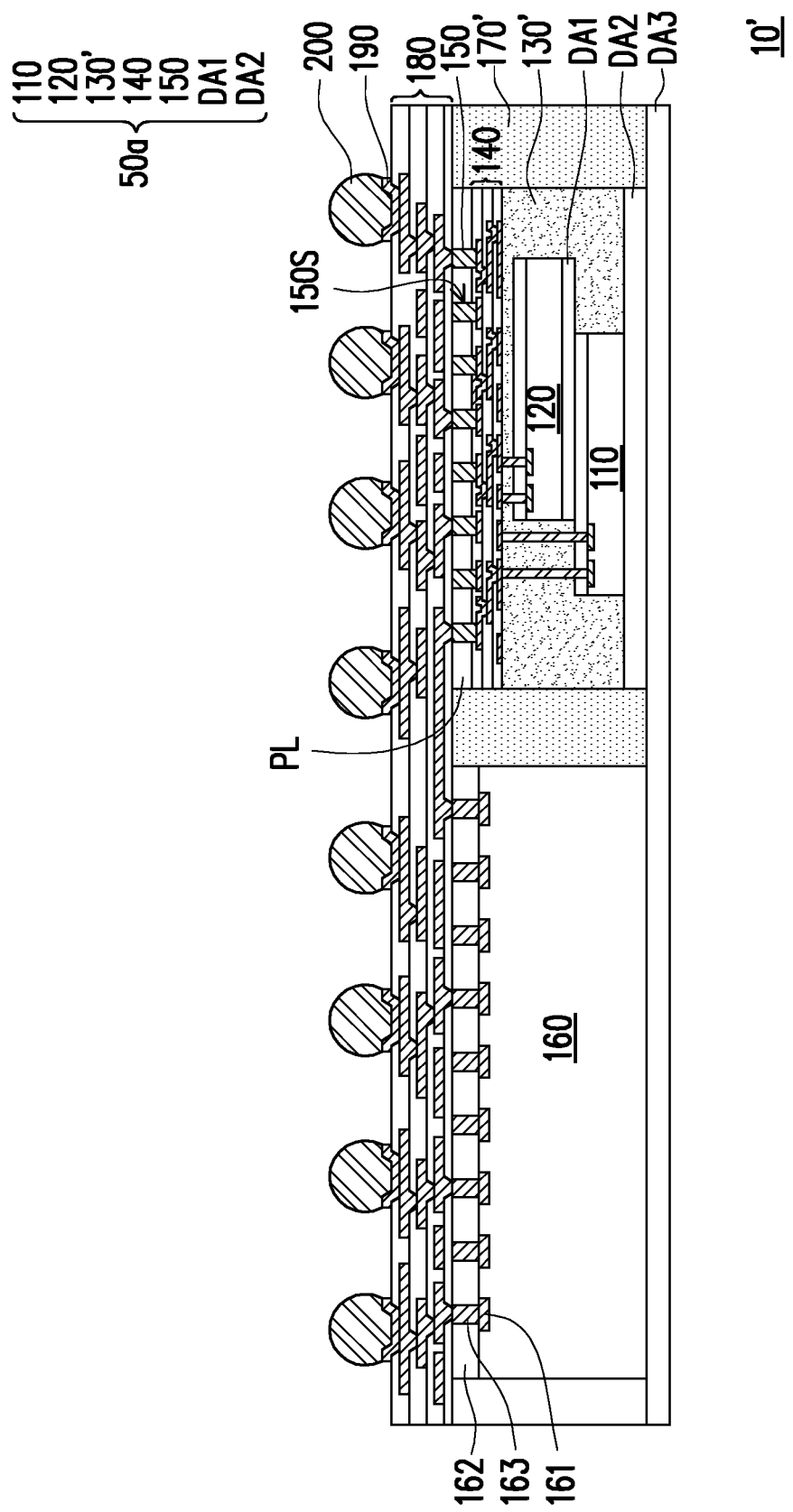
FIG. 14 is a schematic cross sectional view illustrating a chip package in accordance with some exemplary embodiments of the present disclosure.

However, the disclosure is not limited thereto. In some embodiments, a chip package 10' depicted in FIG. 14 is similar to the chip package 10 depicted in FIG. 11, such that the elements similar to or substantially the same as the elements described above will use the same reference numbers, and certain details or descriptions of the same elements and the relationship thereof (e.g. the relative positioning configuration and electrical connection) will not be repeated herein. Referring to the chip package 10 depicted in FIG. 11 and the chip package 10' depicted in FIG. 14 together, the chip package 10' further includes an additional element, a protection layer PL. In some embodiments, the protection layer PL is formed on the integrated fan-out package 50a to wrap at least sidewalls 150S of the conductive features 150. In such embodiments, the top surfaces 150a of the conductive features 150 and a top surface of the protection layer PL are substantially coplanar with the top surface 170a' of the insulating encapsulation 170', as shown in FIG. 14. As shown in FIG. 14, the conductive features 150 of the integrated fan-out package 50a are not in physical contact with the insulating encapsulation 170', for example. Due to the protection layer PL, the conductive features 150 are protected from being damaged during the transferring step of the integrated fan-out package 50a, and thereby the reliability of electrical connections in the chip package 10' is further improved. The material of the protection layer PL may be the same as or different from the materials of the protection layer 112 and/or the protection 122, and thus are not repeated herein.

Figure 15:
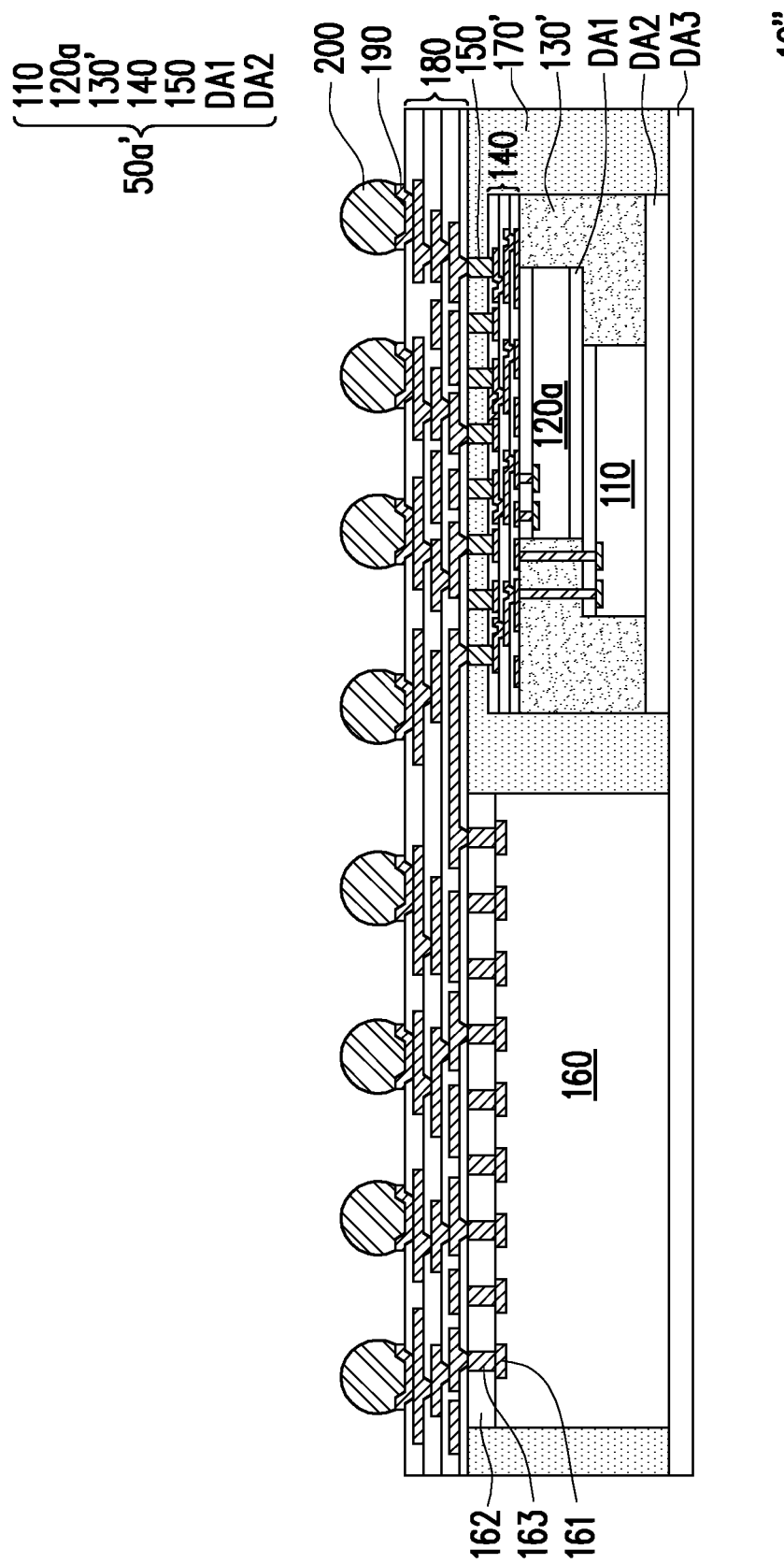
FIG. 15 is a schematic cross sectional view illustrating a chip package in accordance with some exemplary embodiments of the present disclosure.

In certain embodiments, a chip package 10" depicted in FIG. 15 is similar to the chip package 10 depicted in FIG. 11, where the elements similar to or substantially the same as the elements described above will use the same reference numbers, and certain details or descriptions of the same elements and the relationship thereof (e.g. the relative positioning configuration and electrical connection) is not repeated herein. Referring to FIG. 11 and FIG. 15 together, the difference is that, for the chip package 10" depicted in FIG. 15, the chip package 10" includes the integrated fan-out package 50a' instead of the integrated fan-out package 50a included in the chip package 10.

Figure 16:
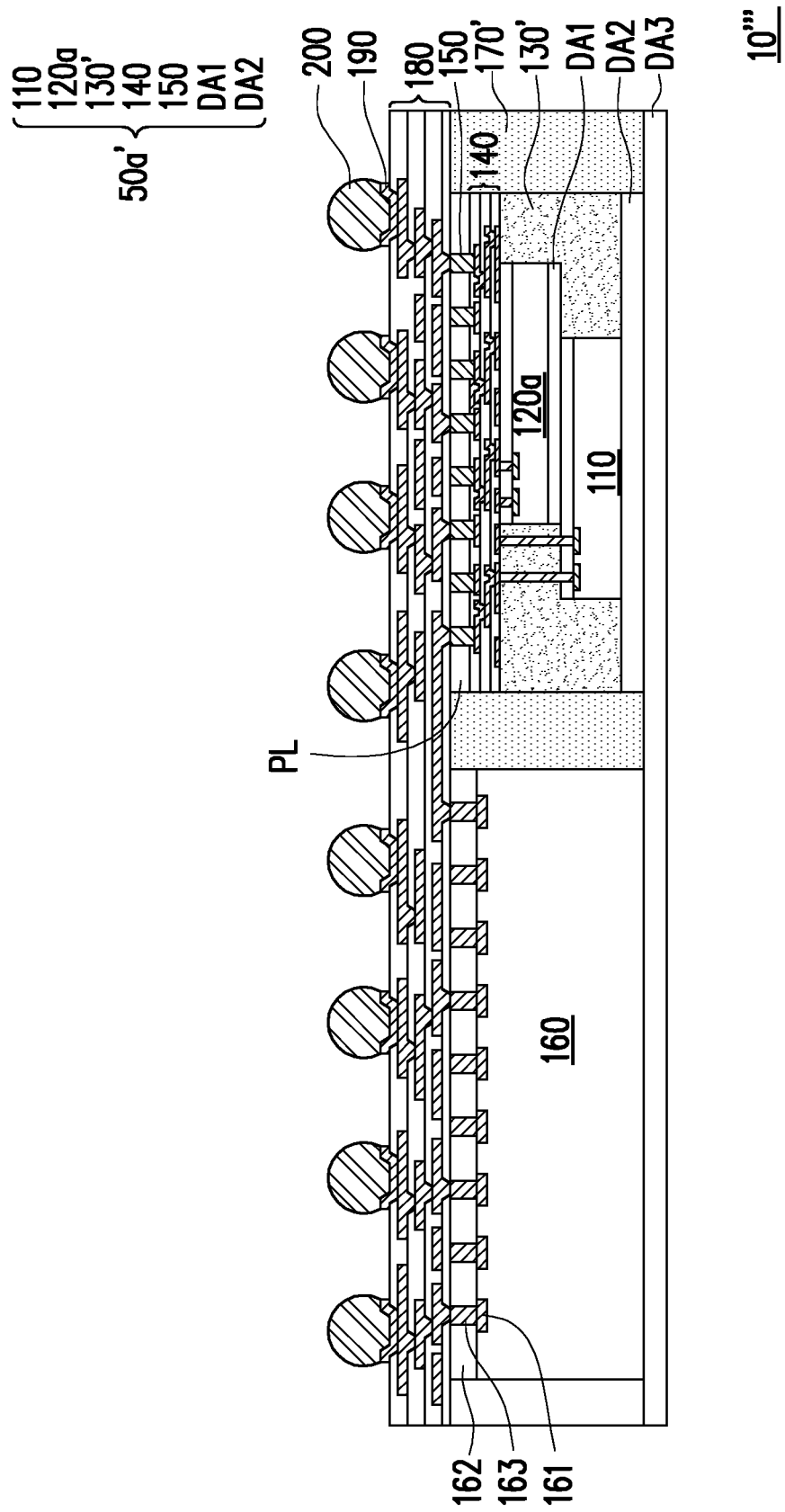
FIG. 16 is a schematic cross sectional view illustrating a chip package in accordance with some exemplary embodiments of the present disclosure.

In some alternative embodiments, a chip package 10''' depicted in FIG. 16 is similar to the chip package 10' depicted in FIG. 14, where the elements similar to or substantially the same as the elements described above will use the same reference numbers, and certain details or descriptions of the same elements and the relationship thereof (e.g. the relative positioning configuration and electrical connection) is not repeated herein. Referring to FIG. 14 and FIG. 16 together, the difference is that, for the chip package 10''' depicted in FIG. 16, the chip package 10''' includes the integrated fan-out package 50a' instead of the integrated fan-out package 50a included in the chip package 10. Due to such configuration, the connecting pillars 123 are protected from being damaged during the transferring step of the semiconductor chip 120a, and thereby the reliability of electrical connections in the integrated fan-out packages 50a' of the chip package 10" and 10''' is further improved.

Figure 17:
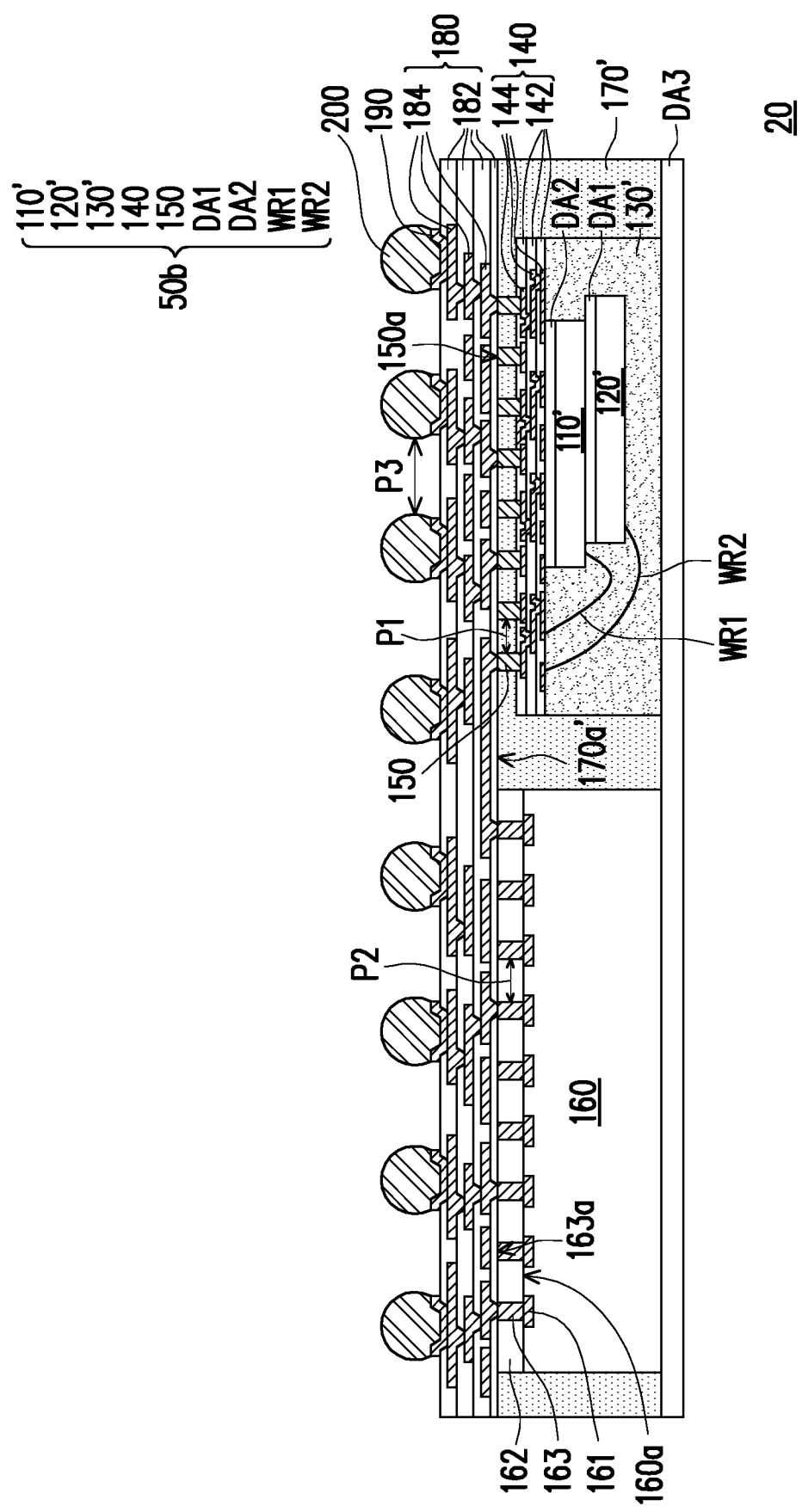
FIG. 17 is a schematic cross sectional view illustrating a chip package in accordance with some exemplary embodiments of the present disclosure.
Figure 18:
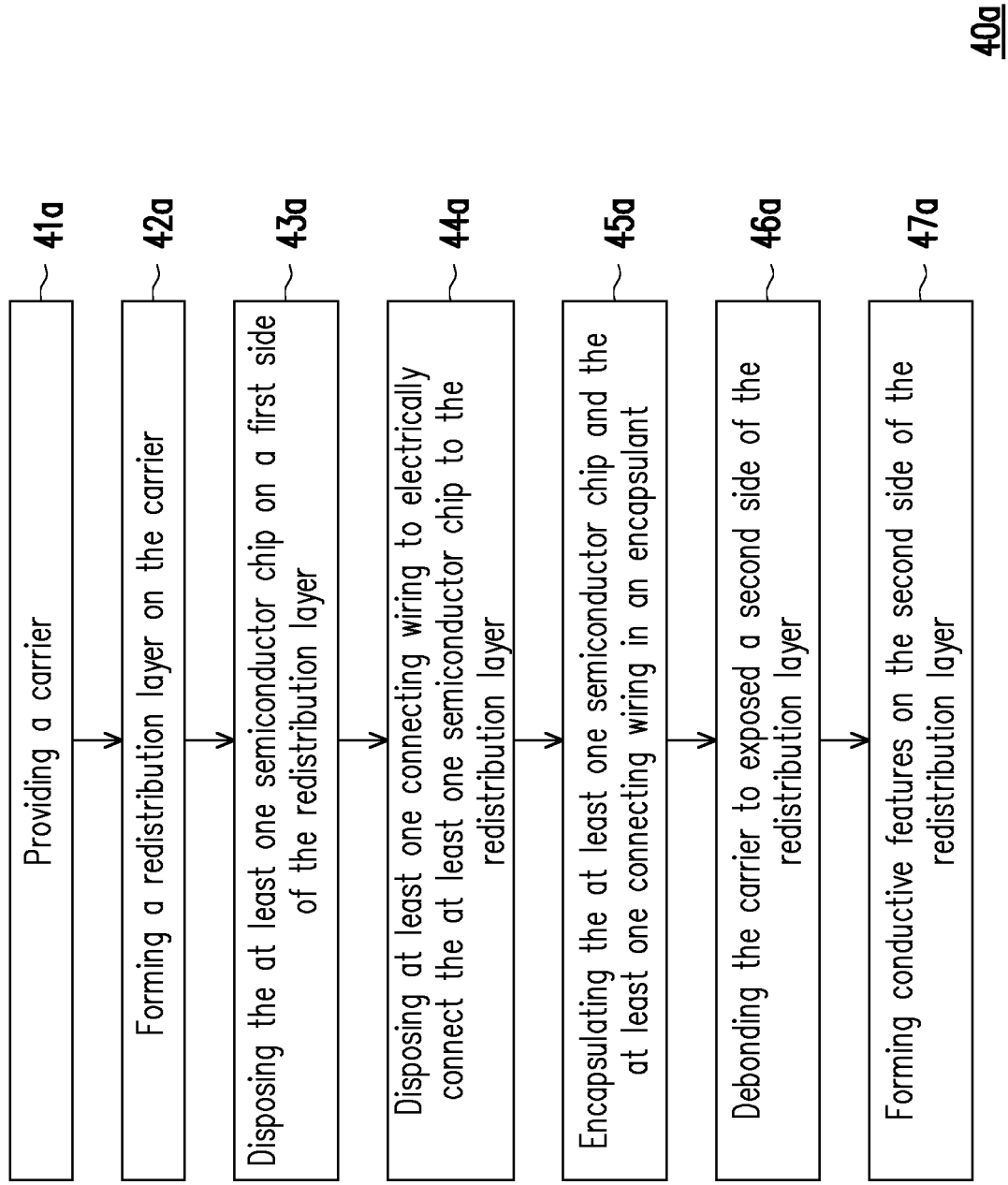
FIG. 18 is a flow chart illustrating a method of forming an integrated fan-out package in accordance with some exemplary embodiments of the present disclosure.

FIG. 17 is a schematic cross sectional view illustrating a chip package in accordance with some exemplary embodiments of the present disclosure. FIG. 18 is a flow chart illustrating a method of forming an integrated fan-out package in accordance with some exemplary embodiments of the present disclosure. Referring to FIG. 11 and FIG. 17 together, the chip package 10 depicted in FIG. 11 and the chip package 20 depicted in FIG. 17 are similar; such that the elements similar to or substantially the same as the elements described above will use the same reference numbers, and certain details or descriptions of the same elements and the relationship thereof (e.g. the relative positioning configuration and electrical connection) will not be repeated herein. Referring to FIG. 11 and FIG. 17 together, the difference is that, for the chip package 20 depicted in FIG. 17, the chip package 20 includes an integrated fan-out package 50b instead of the integrated fan-out package 50a included in the chip package 10.

In some embodiments, the chip package 20 includes a semiconductor chip 160, an insulating encapsulation 170', a redistribution layer 180, UBM patterns 190, and conductive element 200 in addition to the integrated fan-out package 50b.

As shown in FIG. 17, the integrated fan-out package 50b includes a semiconductor chip 110', a semiconductor chip 120', an encapsulant 130', a redistribution layer 140, conductive features 150, and wirings WR1, WR2. As shown in FIG. 17, for example, the semiconductor chip 110' and the semiconductor chip 120' are disposed on the redistribution layer 140, are respectively electrically connected to the redistribution layer 140 through the wiring WR1 and the wiring WR2, and are encapsulated in the encapsulant 130'. In some embodiments, the conductive features 150 are disposed on and electrically connected to the redistribution layer 140, where the redistribution layer 140 is located between the conductive features 150 and the encapsulant 130'. That is, the conductive features 150 are exposed by the encapsulant 130'. In certain embodiments, through the redistribution layer 140, some of the conductive features 150 are electrically connected to the semiconductor chip 110', and some of the conductive features 150 are electrically connected to the semiconductor chip 120'. In certain embodiments, the integrated fan-out package 50b further includes a connecting film DA1 provided between the semiconductor chip 110' and the semiconductor chip 120', and a connecting film DA2 provided between the semiconductor chip 110' and the redistribution layer 140. Due to the connecting film DA1, the semiconductor chip 120' is stably adhered to the semiconductor chip 110'; and due to the connecting film DA2, the semiconductor chip 110' is stably adhered to the redistribution layer 140.

In some embodiments, the semiconductor chip 110' and/or the semiconductor chip 120' include low-power (LP) double data rate (DDR) memory modules, such as LPDDR1, LPDDR2, LPDDR3, LPDDR4, or the like memory modules. However, the disclosure is not limited thereto; in an alternative embodiment, the semiconductor chip 110' and/or the semiconductor chip 120' may include wireless and radio frequency (RF) chips, digital chips, analog chips or mixed signal chips, application-specific integrated circuit ("ASIC") chips, sensor chips, other memory chips, logic chips or voltage regulator chips. In one embodiment, the semiconductor chip 110' and the semiconductor chip 120' may be the same type. In an alternative embodiment, the semiconductor chip 110' and the semiconductor chip 120' may be different types.

In some embodiments, the semiconductor chip 160 includes an active surface 160a, contact pads 161 distributed thereon, the protection layer 162 partially exposing the contact pads 161, and the connecting pillars 163 penetrating the protection layer 162 and electrically connected to the contact pads 161.

In some embodiments, the integrated fan-out package 50b and the semiconductor chip 160 are encapsulated in the insulating encapsulation 170', where top surfaces 163a of the connecting pillars 163 of the semiconductor chip 160, top surfaces 150a of the conductive features 150 of the integrated fan-out package 50b are substantially leveled with and coplanar to a top surface 170a' of the insulating encapsulation 170'. In some embodiments, the redistribution layer 180 is located on the integrated fan-out package 50b, the semiconductor chip 160, and the insulating encapsulation 170', and the redistribution layer 180 is electrically connected to the integrated fan-out package 50b and the semiconductor chip 160 through the conductive features 150 and the connecting pillars 163, respectively; so that the integrated fan-out package 50b and the semiconductor chip 160 are electrically communicated to each other through the redistribution layer 180. With such configuration, a short electrical connection path from the semiconductor chip 160 to the integrated fan-out package 50b is achieved; the chip package 20 has better electrical performance. In some embodiments, the conductive elements 200 are electrically connected to the redistribution layer 180 through the UBM pattern 190, where some of the conductive elements 200 are electrically connected to the semiconductor chip 160 through some of the UBM patterns 190 and the redistribution layer 180, and some of the conductive elements 200 are electrically connected to the integrated fan-out package 50b through some of the UBM patterns 190 and the redistribution layer 180. Due to the integrated fan-out package 50b and the semiconductor chip 160 are both encapsulated in the insulating encapsulation 170', a thickness of the chip package 20 is significantly reduced.

In some embodiments, the processes described in FIG. 1 to FIG. 6 can be substituted with the processes described in the flow chart 40a of FIG. 18 to form the integrated fan-out package 50b, and then the previously described manufacturing process as described in FIG. 7 to FIG. 11 above can be performed to form the chip package 20 depicted in FIG. 17. Referring to FIG. 18, at step 41a, in some embodiments, a carrier is provided. For example, the carrier C1 is provided. In an alternative embodiment, the debond layer DB1, the connecting film DA2, and/or the insulating layer (not shown) may be formed on the carrier C1, the disclosure is not limited thereto. Referring to FIG. 18, at step 42a, in some embodiments, a redistribution layer is formed on the carrier. For example, the redistribution layer similar to the redistribution layer 140 depicted in FIG. 5 is formed on the carrier C1. Referring to FIG. 18, at step 43a, in some embodiments, at least one semiconductor chip is disposed on a first side of the redistribution layer. For example, the semiconductor chip 110' and the semiconductor chip 120' are picked up and placed on the redistribution layer 140 and over the carrier C1. In an alternative embodiment, additional connecting films may be formed between the redistribution layer 140, the semiconductor chip 110', and the semiconductor chip 120' to enhance the adhesion degree thereof. Referring to FIG. 18, at step 44a, in some embodiments, at least one connecting wiring is disposed to electrically connect the at least one semiconductor chip to the redistribution layer. For example, the wirings WR1, WR2 are provided and disposed to electrically connect the semiconductor chip 110' and the semiconductor chip 120' to the redistribution layer 140, respectively. Referring to FIG. 18, at step 45a, in some embodiments, the at least one semiconductor chip and the at least one connecting wiring are encapsulated in an encapsulant. For example, the semiconductor chip 110', the semiconductor chip 120', and the wirings WR1, WR2 are encapsulated in the encapsulant 130'. Referring to FIG. 18, at step 46a, in some embodiments, the carrier is debonded to expose a second side of the redistribution layer, where the second side is opposite to the first side. For example, the carrier C1 is debonded to expose the redistribution layer 140, so that a surface of the redistribution layer 140 not contacting the encapsulant 130' is exposed. Referring to FIG. 18, at step 47a, in some embodiments, conductive features are formed on the second side of the redistribution layer, where the conductive features are electrically connected to the redistribution layer and exposed by the encapsulant, so that the redistribution layer are located between the encapsulant and the conductive features, and sidewalls of the conductive features are physically contacted to the insulating encapsulation. For example, the conductive features 150 are formed on the surface of the redistribution layer 140 not contacting the encapsulant 130', where the conductive features 150 are electrically connected to the redistribution layer 140 and exposed by the encapsulant 130', such that the redistribution layer 140 is located between the conductive features 150 and the encapsulant 130', and sidewalls of the conductive features 150 are physically contacted to the insulating encapsulation 170'. Up to here, the integrated fan-out package 50b is completed.

Figure 19:
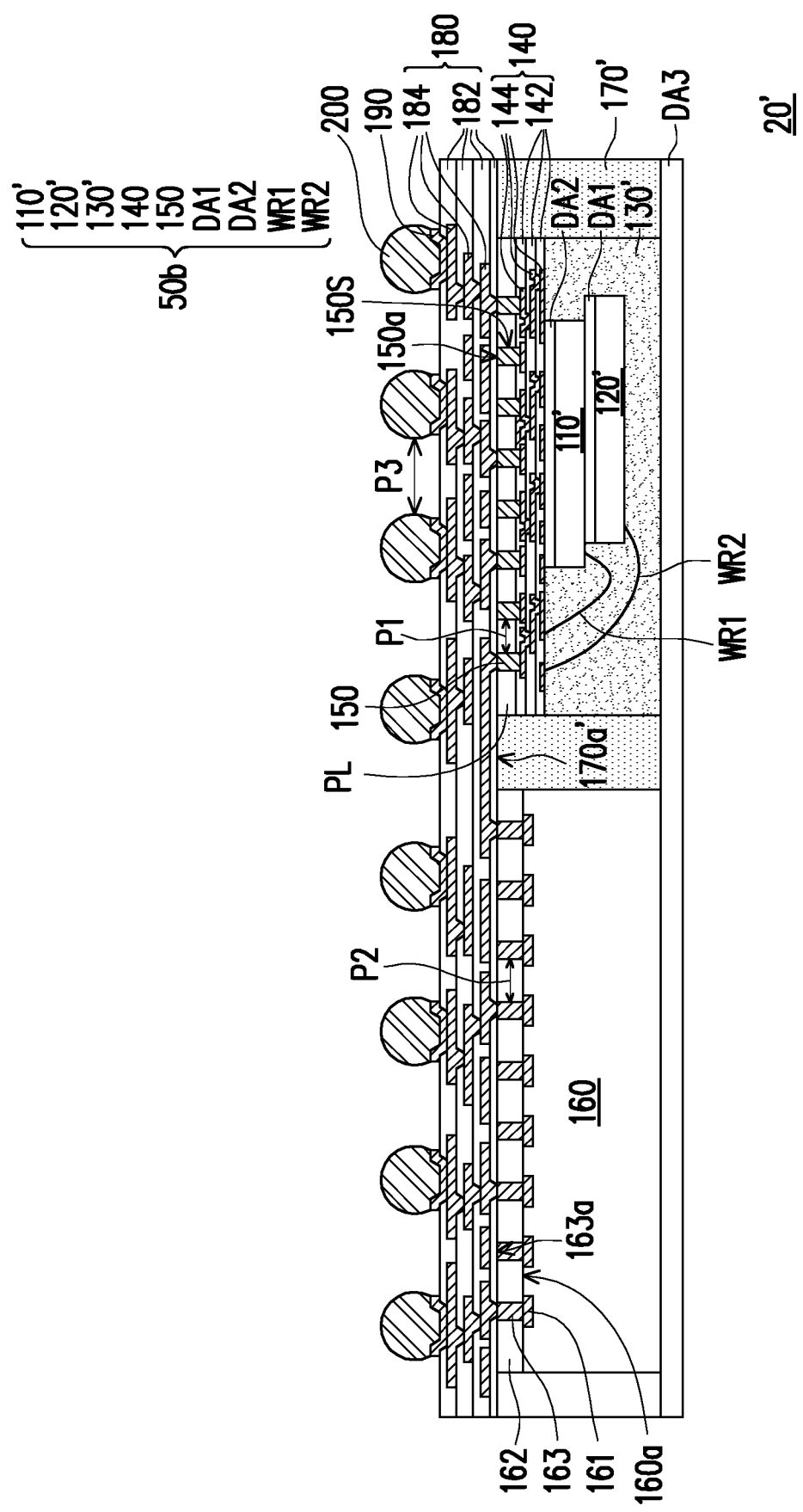
FIG. 19 is a schematic cross sectional view illustrating a chip package in accordance with some exemplary embodiments of the present disclosure.

In some embodiments, a chip package 20' depicted in FIG. 19 is similar to the chip package 20 depicted in FIG. 17, such that the elements similar to or substantially the same as the elements described above will use the same reference numbers, and certain details or descriptions of the same elements and the relationship thereof (e.g. the relative positioning configuration and electrical connection) will not be repeated herein. Referring to the chip package 20 depicted in FIG. 17 and the chip package 20' depicted in FIG. 19 together, the chip package 20' further includes an additional element, a protection layer PL. In some embodiments, the protection layer PL is formed on the integrated fan-out package 50b to wrap at least sidewalls 150S of the conductive features 150. In such embodiments, the top surfaces 150a of the conductive features 150 and a top surface of the protection layer PL are substantially coplanar with the top surface 170a' of the insulating encapsulation 170', as shown in FIG. 19. As shown in FIG. 19, the conductive features 150 of the integrated fan-out package 50b are not in physical contact with the insulating encapsulation 170', for example. Due to the protection layer PL, the conductive features 150 are protected from being damaged during the transferring step of the integrated fan-out package 50b, and thereby the reliability of electrical connections in the chip package 20' is further improved.

Figure 20:
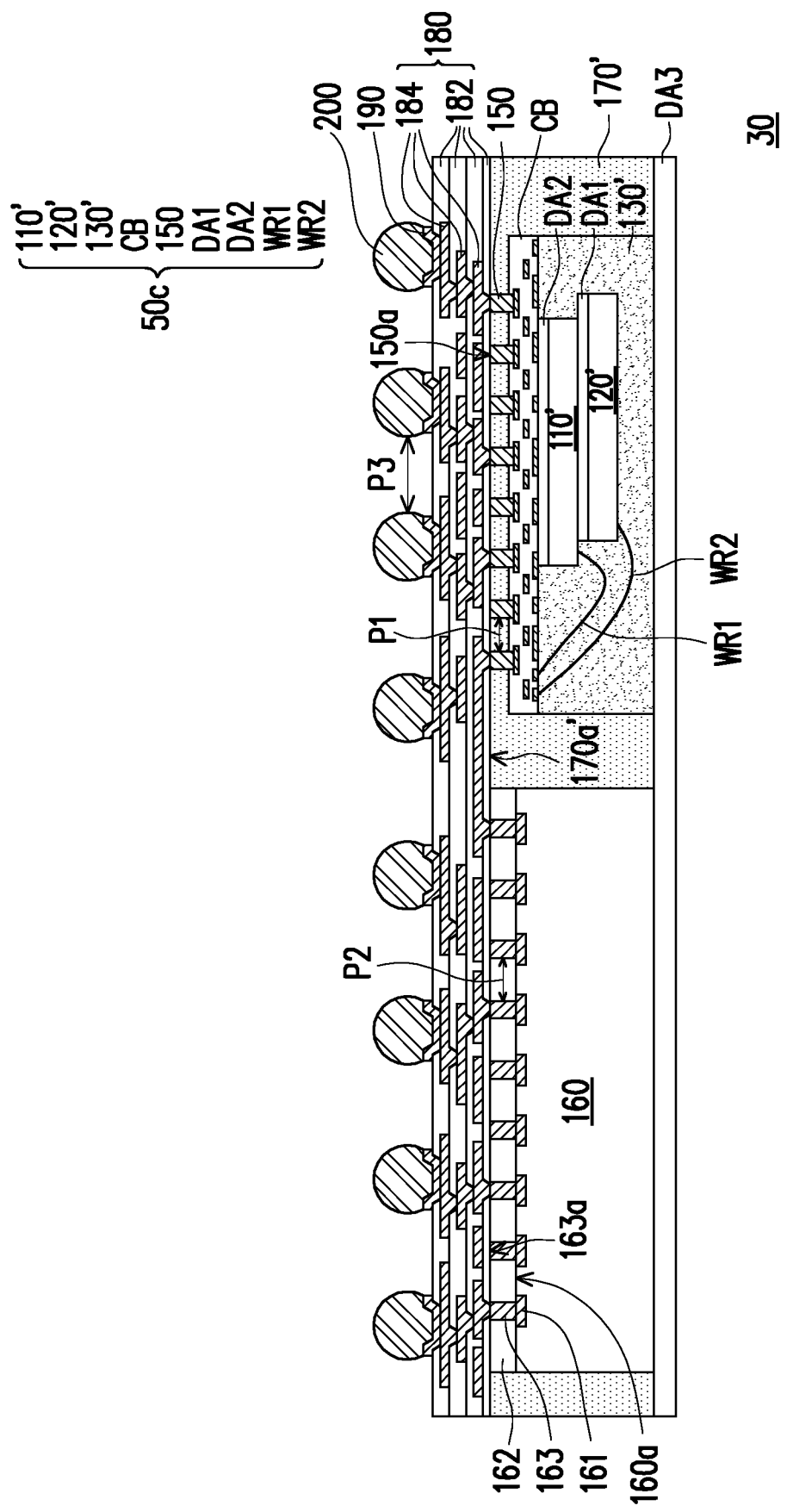
FIG. 20 is a schematic cross sectional view illustrating a chip package in accordance with some exemplary embodiments of the present disclosure.
Figure 21:
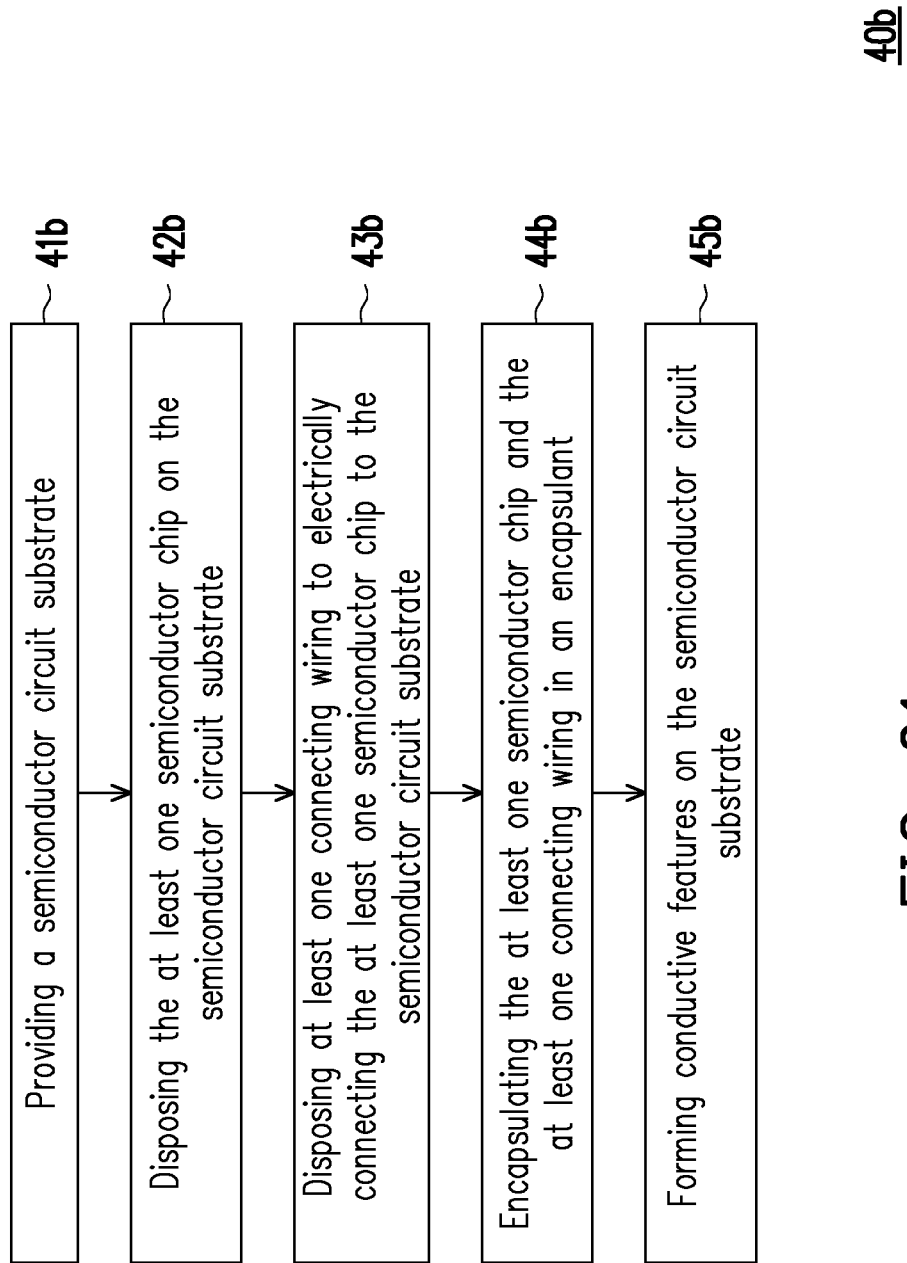
FIG. 21 is a flow chart illustrating a method of forming an integrated fan-out package in accordance with some exemplary embodiments of the present disclosure.

FIG. 20 is a schematic cross sectional view illustrating a chip package in accordance with some exemplary embodiments of the present disclosure. FIG. 21 is a flow chart illustrating a method of forming an integrated fan-out package in accordance with some exemplary embodiments of the present disclosure. Referring to FIG. 11 and FIG. 20 together, the chip package 10 depicted in FIG. 11 and the chip package 30 depicted in FIG. 20 are similar; such that the elements similar to or substantially the same as the elements described above will use the same reference numbers, and certain details or descriptions of the same elements and the relationship thereof (e.g. the relative positioning configuration and electrical connection) will not be repeated herein. Referring to FIG. 11 and FIG. 20 together, the difference is that, for the chip package 30 depicted in FIG. 20, the chip package 30 includes an integrated fan-out package 50c instead of the integrated fan-out package 50a included in the chip package 10.

In some embodiments, the chip package 30 includes a semiconductor chip 160, an insulating encapsulation 170', a redistribution layer 180, UBM patterns 190, and conductive element 200 in addition to the integrated fan-out package 50c.

As shown in FIG. 20, the integrated fan-out package 50c includes a semiconductor chip 110', a semiconductor chip 120', an encapsulant 130', a semiconductor circuit substrate CB, conductive features 150, and wirings WR1, WR2. As shown in FIG. 20, for example, the semiconductor chip 110' and the semiconductor chip 120' are disposed on the semiconductor circuit substrate CB, are respectively electrically connected to the semiconductor circuit substrate CB through the wiring WR1 and the wiring WR2, and are encapsulated in the encapsulant 130'. In some embodiments, the conductive features 150 are disposed on and electrically connected to the semiconductor circuit substrate CB, where the semiconductor circuit substrate CB is located between the conductive features 150 and the encapsulant 130'. That is, the conductive features 150 are exposed by the encapsulant 130'. In certain embodiments, through the semiconductor circuit substrate CB, some of the conductive features 150 are electrically connected to the semiconductor chip 110', and some of the conductive features 150 are electrically connected to the semiconductor chip 120'. In certain embodiments, the integrated fan-out package 50c further includes a connecting film DA1 provided between the semiconductor chip 110' and the semiconductor chip 120', and a connecting film DA2 provided between the semiconductor chip 110' and the semiconductor circuit substrate CB. Due to the connecting film DA1, the semiconductor chip 120' is stably adhered to the semiconductor chip 110'; and due to the connecting film DA2, the semiconductor chip 110' is stably adhered to the semiconductor circuit substrate CB.

In some embodiments, the semiconductor chip 160 includes an active surface 160a, contact pads 161 distributed thereon, the protection layer 162 partially exposing the contact pads 161, and the connecting pillars 163 penetrating the protection layer 162 and electrically connected to the contact pads 161.

In some embodiments, the integrated fan-out package 50c and the semiconductor chip 160 are encapsulated in the insulating encapsulation 170', where top surfaces 163a of the connecting pillars 163 of the semiconductor chip 160, top surfaces 150a of the conductive features 150 of the integrated fan-out package 50c are substantially leveled with and coplanar to a top surface 170a' of the insulating encapsulation 170'. In some embodiments, the redistribution layer 180 is located on the integrated fan-out package 50c, the semiconductor chip 160, and the insulating encapsulation 170', and the redistribution layer 180 is electrically connected to the integrated fan-out package 50c and the semiconductor chip 160 through the conductive features 150 and the connecting pillars 163, respectively; so that the integrated fan-out package 50c and the semiconductor chip 160 are electrically communicated to each other through the redistribution layer 180. With such configuration, a short electrical connection path from the semiconductor chip 160 to the integrated fan-out package 50c is achieved; the chip package 20 has better electrical performance. In some embodiments, the conductive elements 200 are electrically connected to the redistribution layer 180 through the UBM pattern 190, where some of the conductive elements 200 are electrically connected to the semiconductor chip 160 through some of the UBM patterns 190 and the redistribution layer 180, and some of the conductive elements 200 are electrically connected to the integrated fan-out package 50c through some of the UBM patterns 190 and the redistribution layer 180. Due to the integrated fan-out package 50c and the semiconductor chip 160 are both encapsulated in the insulating encapsulation 170', a thickness of the chip package 30 is significantly reduced.

In some embodiments, the processes described in FIG. 1 to FIG. 6 can be substituted with the processes described in the flow chart 40b of FIG. 21 to form the integrated fan-out package 50c, and then the previously described manufacturing process as described in FIG. 7 to FIG. 11 above can be performed to form the chip package 30 depicted in FIG. 20.

Referring to FIG. 21, at step 41b, in some embodiments, a semiconductor circuit substrate is provided. For example, a semiconductor circuit substrate CB is provided. In one embodiment, the semiconductor circuit substrate CB may be a printed circuit board (PCB), or an organic substrate having an interconnection circuit structure therein, the disclosure is not limited thereto. Referring to FIG. 21, at step 42b, in some embodiments, at least one semiconductor chip is disposed on the semiconductor circuit substrate. For example, the semiconductor chip 110' and the semiconductor chip 120' are picked up and placed on the semiconductor circuit substrate CB. In an alternative embodiment, additional connecting films may be formed between the semiconductor circuit substrate CB, the semiconductor chip 110', and the semiconductor chip 120' to enhance the adhesion degree thereof. Referring to FIG. 21, at step 43b, in some embodiments, at least one connecting wiring is disposed to electrically connect the at least one semiconductor chip to the semiconductor circuit substrate. For example, the wirings WR1, WR2 are provided and disposed to electrically connect the semiconductor chip 110' and the semiconductor chip 120' to the semiconductor circuit substrate CB, respectively. Referring to FIG. 21, at step 44b, in some embodiments, the at least one semiconductor chip and the at least one connecting wiring are encapsulated in an encapsulant. For example, the semiconductor chip 110', the semiconductor chip 120', and the wirings WR1, WR2 are encapsulated in the encapsulant 130'. Referring to FIG. 21, at step 45b, conductive features are formed on the semiconductor circuit substrate, where the conductive features are electrically connected to the semiconductor circuit substrate and exposed by the encapsulant, so that the semiconductor circuit substrate are located between the encapsulant and the conductive features, and sidewalls of the conductive features are physically contacted to the insulating encapsulation. For example, the conductive features 150 are formed on the surface of the semiconductor circuit substrate CB not contacting the encapsulant 130', where the conductive features 150 are electrically connected to the semiconductor circuit substrate CB and exposed by the encapsulant 130', such that the semiconductor circuit substrate CB is located between the conductive features 150 and the encapsulant 130', and sidewalls of the conductive features 150 are physically contacted to the insulating encapsulation 170'. Up to here, the integrated fan-out package 50c is completed.

Figure 22:
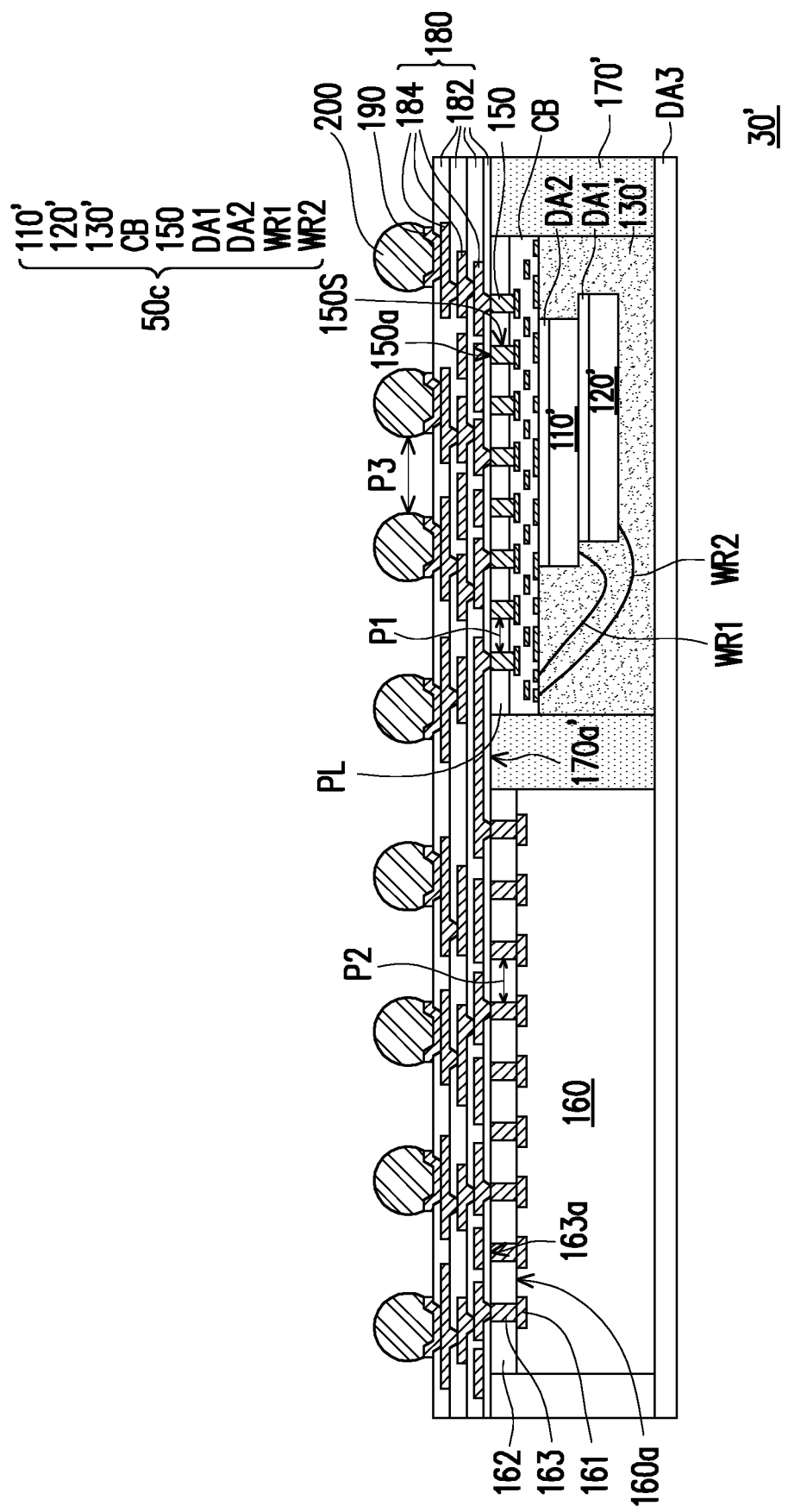
FIG. 22 is a schematic cross sectional view illustrating a chip package in accordance with some exemplary embodiments of the present disclosure.

In some embodiments, a chip package 30' depicted in FIG. 22 is similar to the chip package 30 depicted in FIG. 20, such that the elements similar to or substantially the same as the elements described above will use the same reference numbers, and certain details or descriptions of the same elements and the relationship thereof (e.g. the relative positioning configuration and electrical connection) will not be repeated herein. Referring to the chip package 30 depicted in FIG. 20 and the chip package 30' depicted in FIG. 22 together, the chip package 30' further includes an additional element, a protection layer PL. In some embodiments, the protection layer PL is formed on the integrated fan-out package 50c to wrap at least sidewalls 150S of the conductive features 150. In such embodiments, the top surfaces 150a of the conductive features 150 and a top surface of the protection layer PL are substantially coplanar with the top surface 170a' of the insulating encapsulation 170', as shown in FIG. 22. As shown in FIG. 22, the conductive features 150 of the integrated fan-out package 50c are not in physical contact with the insulating encapsulation 170', for example. Due to the protection layer PL, the conductive features 150 are protected from being damaged during the transferring step of the integrated fan-out package 50c, and thereby the reliability of electrical connections in the chip package 30' is further improved.

In accordance with some embodiments, a chip package includes a redistribution layer, at least one first semiconductor chip, an integrated fan-out package, and an insulating encapsulation. The at least one first semiconductor chip and the integrated fan-out package are electrically connected to the redistribution layer, wherein the at least one first semiconductor chip and the integrated fan-out package are located on a surface of the redistribution layer and electrically communicated to each other through the redistribution layer, and wherein the integrated fan-out package includes at least one second semiconductor chip. The insulating encapsulation encapsulates the at least one first semiconductor chip and the integrated fan-out package.

In accordance with some embodiments, a chip package includes a redistribution layer, at least one first semiconductor chip, an integrated fan-out package, and an insulating encapsulation. The at least one first semiconductor chip and the integrated fan-out package are electrically connected to the redistribution layer, wherein the at least one first semiconductor chip and the integrated fan-out package are located on a surface of the redistribution layer and electrically communicated to each other through the redistribution layer. The integrated fan-out package includes a redistribution circuit structure, at least one second semiconductor chip and at least third semiconductor chip located on and electrically connected to the redistribution circuit structure, an encapsulant encapsulating the at least one second semiconductor chip and the at least third semiconductor chip, and conductive features located on and electrically connected to the redistribution circuit structure. The redistribution circuit structure is located between the encapsulant and the conductive features. The insulating encapsulation, encapsulating the at least one first semiconductor chip and the integrated fan-out package.

In accordance with some embodiments, a manufacturing method of a chip package is provided with the following steps: providing a first carrier; disposing at least one first semiconductor chip and an integrated fan-out package on the first carrier, the integrated fan-out package including at least one second semiconductor chip; encapsulating the at least one first semiconductor chip and the integrated fan-out package in an insulating encapsulation; forming a redistribution layer on the insulating encapsulation, the redistribution layer being electrically connected to the at least one first semiconductor chip and the integrated fan-out package, wherein the at least one first semiconductor chip and the integrated fan-out package are arranged side-by-side and on a surface of the redistribution layer; disposing conductive elements on the redistribution layer, wherein the redistribution layer is located between the insulating encapsulation and the conductive elements; and debonding the first carrier.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A chip package, comprising:
  a redistribution layer;
  at least one first semiconductor chip and an integrated fan-out package, electrically connected to the redistribution layer, wherein the at least one first semiconductor chip and the integrated fan-out package are located on a surface of the redistribution layer and electrically communicated to each other through the redistribution layer, and wherein the integrated fan-out package comprises second semiconductor chips and an encapsulant covering the second semiconductor chips; and
  an insulating encapsulation, encapsulating the at least one first semiconductor chip and the integrated fan-out package and covering a sidewall of the encapsulant.

2. The chip package of claim 1, wherein the redistribution layer is overlapped with the at least one first semiconductor chip and the integrated fan-out package.

3. The chip package of claim 1, wherein the integrated fan-out package comprises:
  a redistribution circuit structure;
  the second semiconductor chips, located on and electrically connected to the redistribution circuit structure;
  the encapsulant, encapsulating the second semiconductor chips; and
  conductive features, located on and electrically connected to the redistribution circuit structure, wherein the redistribution circuit structure is located between the encapsulant and the conductive features.

4. The chip package of claim 3, wherein the redistribution circuit structure is a redistribution circuit layer, and the integrated fan-out package further comprises:
  connecting wirings, encapsulated in the encapsulant, wherein the second semiconductor chips are electrically connected to the redistribution circuit layer through the connecting wirings.

5. The chip package of claim 3, wherein the redistribution circuit structure is a redistribution circuit layer, and the integrated fan-out package further comprises:
  conductive pillars, disposed on the second semiconductor chips, wherein the second semiconductor chips are electrically connected to the redistribution circuit layer through the conductive pillars.

6. The chip package of claim 3, wherein the redistribution circuit structure is a semiconductor circuit substrate, and the integrated fan-out package further comprises:
  connecting wirings, encapsulated in the encapsulant,
  wherein the second semiconductor chips are electrically connected to the semiconductor circuit substrate through the connecting wirings.

7. The chip package of claim 3, wherein the conductive features are exposed by the encapsulant, and sidewalls of the conductive features are physically contacted to the insulating encapsulation.

8. A chip package, comprising:
  a redistribution layer;
  at least one first semiconductor chip and an integrated fan-out package, electrically connected to the redistribution layer, wherein the at least one first semiconductor chip and the integrated fan-out package are located on a surface of the redistribution layer and electrically communicated to each other through the redistribution layer, and wherein the integrated fan-out package comprises:
    a redistribution circuit structure;
    at least one second semiconductor chip and at least third semiconductor chip, located on and electrically connected to the redistribution circuit structure;
    an encapsulant, encapsulating the at least one second semiconductor chip and the at least third semiconductor chip; and
    conductive features, located on and electrically connected to the redistribution circuit structure, wherein the redistribution circuit structure is located between the encapsulant and the conductive features; and
  an insulating encapsulation, encapsulating the at least one first semiconductor chip and the integrated fan-out package.

9. The chip package of claim 8, further comprising:
  conductive elements, connecting to the redistribution layer, wherein the redistribution layer is located between the insulating encapsulation and the conductive elements.

10. The chip package of claim 9, wherein a pitch of two adjacent conductive elements of the conductive elements is greater than a pitch of two adjacent conductive features of the conductive features.

11. The chip package of claim 8, wherein the at least one first semiconductor chip comprises:
   a semiconductor substrate, having an active surface;
   contact pads, distributed on the active surface;
   contact pillars, connecting to the contact pads, respectively; and
   a protection layer, located on the active surface and covering portions of the contact pads, wherein the contact pillars are embedded in and penetrate the protection layer,
   wherein top surfaces of the contact pillars, a top surface of the protection layer, top surfaces of the conductive features, and a top surface of the insulating encapsulation are substantially leveled and coplanar to one another.

12. The chip package of claim 8, wherein the conductive features are exposed by the encapsulant, and sidewalls of the conductive features are physically contacted to the insulating encapsulation.

13. The chip package of claim 8, wherein the redistribution circuit structure is a redistribution circuit layer, and the integrated fan-out package further comprises:
   connecting wirings, encapsulated in the encapsulant,
   wherein the at least one second semiconductor chip and the at least third semiconductor chip are electrically connected to the redistribution circuit layer through the connecting wirings, respectively.

14. The chip package of claim 8, wherein the redistribution circuit structure is a redistribution circuit layer, and the integrated fan-out package further comprises:
   at least one first conductive pillar, disposed on the at least one second semiconductor chip, wherein the at least one second semiconductor chip is electrically connected to the redistribution circuit layer through the at least one first conductive pillar; and
   at least one second conductive pillar, disposed on the at least one third semiconductor chip, wherein the at least one third semiconductor chip is electrically connected to the redistribution circuit layer through the at least one second conductive pillar.

15. The chip package of claim 8, wherein the redistribution circuit structure is a semiconductor circuit substrate, and the integrated fan-out package further comprises:
   connecting wirings, encapsulated in the encapsulant,
   wherein the at least one second semiconductor chip and the at least third semiconductor chip are electrically connected to the semiconductor circuit substrate through the connecting wirings.

16. A manufacturing method of a chip package, comprising:
   providing a first carrier;
   disposing at least one first semiconductor chip and an integrated fan-out package on the first carrier, the integrated fan-out package comprising second semiconductor chips and an encapsulant covering the second semiconductor chips;
   encapsulating the at least one first semiconductor chip and the integrated fan-out package in an insulating encapsulation, a sidewall of the encapsulant being covering by the insulating encapsulation;
   forming a redistribution layer on the insulating encapsulation, the redistribution layer being electrically connected to the at least one first semiconductor chip and the integrated fan-out package, wherein the at least one first semiconductor chip and the integrated fan-out package are arranged side-by-side and on a surface of the redistribution layer, and the at least one first semiconductor chip and the integrated fan-out package are electrically communicated to each other through the redistribution layer;
   disposing conductive elements on the redistribution layer, wherein the redistribution layer is located between the insulating encapsulation and the conductive elements; and
   debonding the first carrier.

17. The manufacturing method as claimed in claim 16, further comprising:
   planarizing the insulating encapsulation to substantially level a top surface of the at least one first semiconductor chip, a top surface of the integrated fan-out package on the first carrier, and a top surface of the insulating encapsulation.

18. The manufacturing method as claimed in claim 16, before disposing the at least one first semiconductor chip and the integrated fan-out package on the first carrier, further comprising forming the integrated fan-out package, wherein forming the integrated fan-out package comprises:
   providing a second carrier;
   forming a redistribution circuit layer on the second carrier;
   disposing the second semiconductor chips on a first side of the redistribution circuit layer;
   disposing connecting wirings to electrically connect the second semiconductor chips to the redistribution circuit layer;
   encapsulating the second semiconductor chips and the connecting wirings in the encapsulant;
   debonding the second carrier to expose a second side of the redistribution circuit layer, the second side being opposite to the first side; and
   forming conductive features on the second side of the redistribution circuit layer, the conductive features being electrically connected to the redistribution circuit layer and exposed by the encapsulant, so that the redistribution circuit layer being located between the encapsulant and the conductive features, and sidewalls of the conductive features being physically contacted to the insulating encapsulation.

19. The manufacturing method as claimed in claim 16, before disposing the at least one first semiconductor chip and the integrated fan-out package on the first carrier, further comprising forming the integrated fan-out package, wherein forming the integrated fan-out package comprises:
   providing a second carrier;
   forming conductive pillars on the second semiconductor chips;
   disposing the second semiconductor chips on the second carrier;
   encapsulating the second semiconductor chips in the encapsulant;
   forming a redistribution circuit layer on the encapsulant, the redistribution circuit layer being electrically connected to the second semiconductor chips through the conductive pillars;
   forming conductive features on the redistribution circuit layer, the conductive features being electrically connected to the redistribution circuit layer, and the redistribution circuit layer being located between the encapsulant and the conductive features, so that the conductive features being exposed by the encapsulant, and sidewalls of the conductive features being physically contacted to the insulating encapsulation; and debonding the second carrier.

20. The manufacturing method as claimed in claim 16, before disposing the at least one first semiconductor chip and the integrated fan-out package on the first carrier, further comprising forming the integrated fan-out package, wherein forming the integrated fan-out package comprises:

providing a semiconductor circuit substrate;

disposing the second semiconductor chips on the semiconductor circuit substrate;

disposing connecting wirings to electrically connect the second semiconductor chips to the semiconductor circuit substrate;

encapsulating the second semiconductor chips and the connecting wirings in the encapsulant; and forming conductive features on the semiconductor circuit substrate, the conductive features being electrically connected to the semiconductor circuit substrate, and the semiconductor circuit substrate being located between the encapsulant and the conductive features, so that the conductive features being exposed by the encapsulant, and sidewalls of the conductive features being physically contacted to the insulating encapsulation.

* * * * *